(12) United States Patent
Chern

(10) Patent No.: US 12,154,994 B2
(45) Date of Patent: Nov. 26, 2024

(54) PHOTO SENSING DEVICE AND METHOD OF FABRICATING THE PHOTO SENSING DEVICE

(71) Applicant: TAIWAN SEMICONDUCTOR MANUFACTURING COMPANY LTD., Hsinchu (TW)

(72) Inventor: Chan-Hong Chern, Palo Alto, CA (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/365,177

(22) Filed: Aug. 3, 2023

(65) Prior Publication Data
US 2023/0378384 A1 Nov. 23, 2023

Related U.S. Application Data

(63) Continuation of application No. 17/808,625, filed on Jun. 24, 2022, now Pat. No. 11,824,129, which is a
(Continued)

(51) Int. Cl.
*H01L 31/028* (2006.01)
*H01L 31/0352* (2006.01)
(Continued)

(52) U.S. Cl.
CPC .... *H01L 31/028* (2013.01); *H01L 31/035281* (2013.01); *H01L 31/105* (2013.01); *H01L 31/1804* (2013.01)

(58) Field of Classification Search
CPC . H01L 31/028; H01L 31/1804; H01L 31/105; H01L 31/035281;
(Continued)

(56) References Cited

U.S. PATENT DOCUMENTS 5,796,118 A * 8/1998 Morikawa .............. B82Y 20/00
257/466
6,075,253 A * 6/2000 Sugiyama ............. H01L 31/028
257/466
(Continued)

FOREIGN PATENT DOCUMENTS

KR 20090062483 A * 6/2009 ..... H01L 31/022408

*Primary Examiner* — Earl N Taylor
(74) *Attorney, Agent, or Firm* — WPAT LAW; Anthony King

(57) ABSTRACT

The present disclosure provides a photo sensing device and a method of forming the same. The photo sensing device includes a substrate comprising a silicon layer at a front surface of the substrate; a photosensitive member extending into and at least partially surrounded by the silicon layer, and a composite layer disposed between the photosensitive member and the silicon layer and surrounding the photosensitive member. The silicon layer includes a first doped region adjacent to a first side of the photosensitive member and a second doped region adjacent to a second side of the photosensitive member opposite to the first side. The first doped region has a first conductivity type and includes a heavily doped region and a lightly doped region adjacent to the heavily doped region. The second doped region has a second conductivity type different from the first conductivity type.

20 Claims, 45 Drawing Sheets

Related U.S. Application Data continuation of application No. 16/828,716, filed on Mar. 24, 2020, now Pat. No. 11,404,590.

(60) Provisional application No. 62/903,275, filed on Sep. 20, 2019.

(51) Int. Cl.
*H01L 31/105* (2006.01)
*H01L 31/18* (2006.01)

(58) Field of Classification Search
CPC ............ H01L 31/035272; H01L 31/09; H01L 31/184; Y02P 70/50
See application file for complete search history.

(56) References Cited

U.S. PATENT DOCUMENTS

| | | | | |
|---|---|---|---|---|
| 6,136,628 A * | 10/2000 | Sugiyama | ............ | H01L 31/107 438/57 |
| 6,307,242 B1 * | 10/2001 | Sugiyama | ............ | H01L 31/028 257/E31.011 |
| 6,943,409 B1 * | 9/2005 | Cheng | ................. | B82Y 20/00 257/466 |
| 7,397,101 B1 * | 7/2008 | Masini | ................ | G02B 6/4295 257/656 |
| 9,437,759 B2 * | 9/2016 | Baehr-Jones | ..... | H01L 27/14649 |
| 9,553,222 B2 * | 1/2017 | Baehr-Jones | ..... | H01L 27/14698 |
| 9,812,598 B2 * | 11/2017 | Baehr-Jones | ......... | H01L 31/107 |
| 10,043,927 B2 * | 8/2018 | Baehr-Jones | ......... | H01L 31/107 |
| 10,121,927 B2 * | 11/2018 | Nakayama | ........ | H01L 31/02327 |
| 10,134,938 B2 * | 11/2018 | Novack | ............ | H01L 31/02327 |
| 10,158,036 B2 * | 12/2018 | Usami | ................ | G02B 6/12004 |
| 10,901,150 B2 * | 1/2021 | Novack | ............ | H01L 31/02327 |
| 11,404,590 B2 * | 8/2022 | Chern | ................... | H01L 31/028 |
| 11,824,129 B2 * | 11/2023 | Chern | ................... | H01L 31/028 |
| 2010/0006961 A1 * | 1/2010 | Yasaitis | ................... | H01L 31/18 257/431 |
| 2011/0012221 A1 * | 1/2011 | Fujikata | .......... | H01L 31/022408 257/458 |
| 2011/0037133 A1 * | 2/2011 | Su | ....................... | H01L 31/1808 257/E31.127 |
| 2015/0016769 A1 * | 1/2015 | Verma | ................ | G02B 6/12004 438/69 |
| 2017/0012143 A1 * | 1/2017 | Usami | .................. | H01L 31/105 |
| 2017/0317221 A1 * | 11/2017 | Usami | ............. | H01L 31/035281 |
| 2019/0280146 A1 * | 9/2019 | Baudot | ................. | H01L 31/105 |
| 2019/0378949 A1 * | 12/2019 | Simoyama | ........... | H01L 31/1075 |
| 2020/0313021 A1 * | 10/2020 | Fujikata | .......... | H01L 31/035281 |
| 2020/0393618 A1 * | 12/2020 | Novack | ............ | H01L 31/02327 |
| 2021/0066535 A1 * | 3/2021 | Ludurczak | .......... | H01L 31/1808 |
| 2021/0091239 A1 * | 3/2021 | Chern | ................. | H01L 31/1804 |
| 2021/0091245 A1 * | 3/2021 | Chern | ............. | H01L 31/1804 |
| 2021/0091246 A1 * | 3/2021 | Chern | ............. | H01L 31/035254 |
| 2023/0378384 A1 * | 11/2023 | Chern | ............. | H01L 31/035281 |

* cited by examiner

PHOTO SENSING DEVICE AND METHOD OF FABRICATING THE PHOTO SENSING DEVICE

CROSS REFERENCE TO RELATED APPLICATIONS

This application is a continuation application of U.S. application Ser. No. 17/808,625 filed Jun. 24, 2022, which is a continuation application of U.S. application Ser. No. 16/828,716, filed Mar. 24, 2020, which claims the benefit of U.S. provisional application No. 62/903,275, filed Sep. 20, 2019, which is incorporated by reference in its entirety.

BACKGROUND

In recent years, the semiconductor integrated circuit (IC) industry has experienced rapid growth. Technological advances in IC materials and design have produced generations of ICs where each generation has smaller and more complex circuits than the previous generation.

Photo sensing devices are used to sense radiation such as light. These devices often use arrays of pixels or photodiodes to absorb radiation projected thereto and convert the sensed radiation into electrical signals. As a part of evolution, the size of photo sensing device can be reduced. However, issues related to dark current are more and more difficult to deal with, and furthermore, as the pixel sizes decrease, the amount of photons received by the photo sensing device decreases. As a result, the effect of dark current becomes more pronounced. Therefore, minimizing dark current is a critical issue for advanced technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
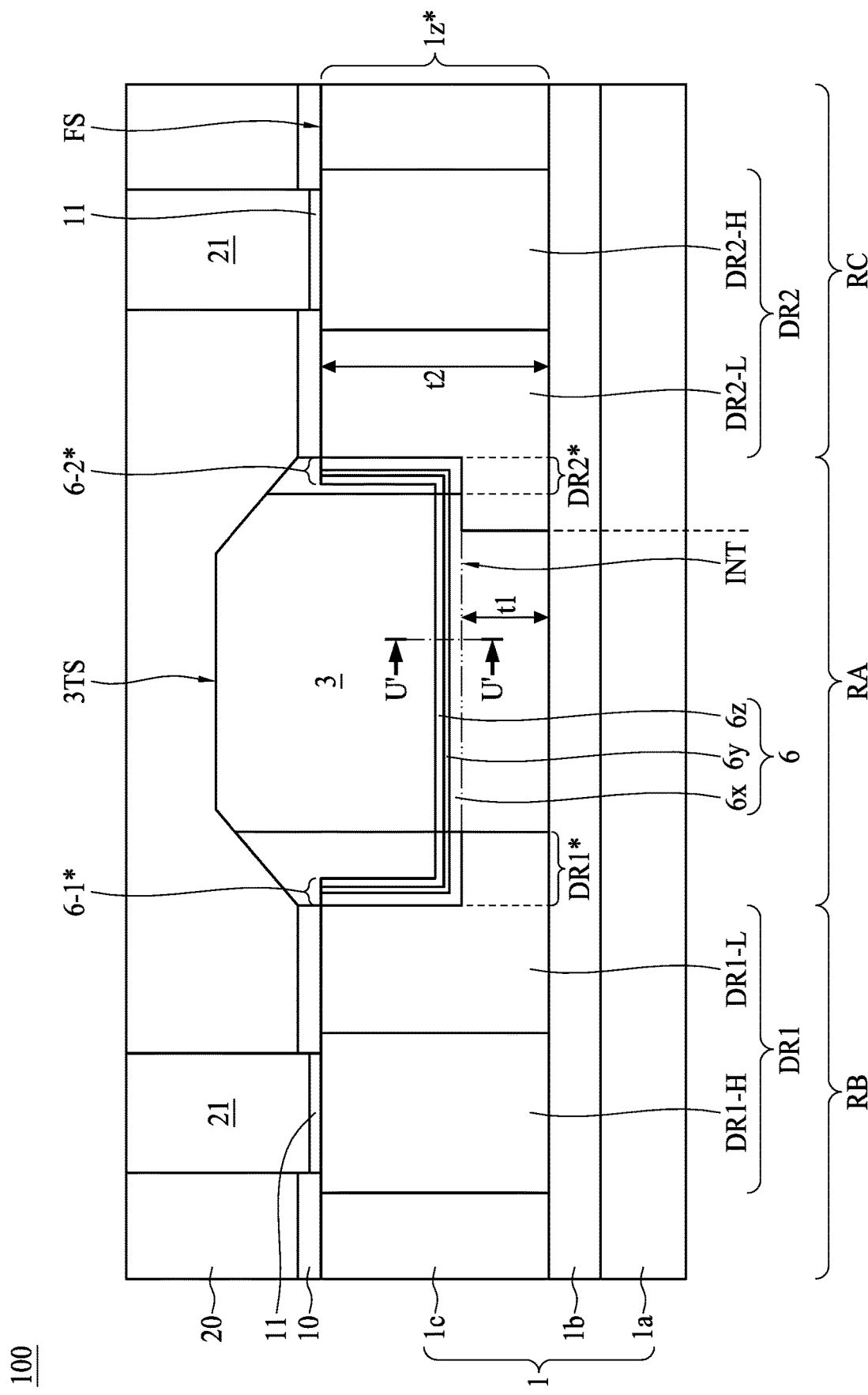
FIG. 1 is a schematic drawing illustrating a cross sectional view of a photo sensing device, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Photosensitive materials can be utilized in photo sensing devices to absorb radiation, such as light, and convert the sensed radiation into electrical signal. In some embodiments, germanium (Ge) can be a material of a photosensitive layer. Particularly in the case of having a substrate including silicon at a top surface, it is beneficial to utilize germanium as the photosensitive materials for absorbing light with wavelength less than an infrared wavelength of less than 1,560 nm-1,600 nm since it is easier and cheaper to integrate germanium with silicon photonics. In the application of communication, devices integrated with germanium sensing layer can be utilized for data-communication (signal having wavelength about 1,310 nm) and longer distance tele-communication (signal having wavelength about 1,550 nm).

However, dislocation defects often arise in the cases of epitaxially growing a material on a substrate having different kinds of materials—often referred to as "heterostructure"—due to different crystalline lattice sizes. During the deposition operation, this lattice mismatch between the substrate and the deposited material causes stress during thermal cycles and may lead to dislocation defects. As a result, this may introduce undesired and abrupt changes in electrical and/or optical properties, which result in deteriorated device performance and/or negative effects (e.g. larger dark current). It is discovered that dark current may cause degraded performance, issues or failures, such as degrading signal-to-noise-ratio (SNR). In addition, in some cases threading dislocation may degrade physical properties of the dislocation and may lead to device failure.

In the example of growing germanium on a silicon substrate, there is a difference between a lattice constant of silicon and a lattice constant of germanium (about 4.2% under certain circumstances). It should be noted that when a thickness of germanium deposited thereon is less than a certain value (for example, 20 Å), the lattice mismatch may not cause obvious misfit dislocation since thinner germanium can be compressed (conformed to silicon lattice) and the lattice mismatch can be alleviated. However, in order to effectively absorbing signals within a certain range (for example, up to about 1,650 nm so that the device can be applied in the field of data-communication and tele-communication), it is more desired for such photo sensing layer to have a thickness greater than a value (for example, greater than 4,000 Å, or can be varied based on the need of certain application. In the example, when the thickness is significantly less than 4,000 Å, the collection of radiation may not be effective). In such case, on the contrary, lattice mismatch may cause detectable misfit dislocation or even threading dislocation, which may lead to degraded device performance, as the lattice mismatch may not be effectively alleviated by material conformation herein due to greater thickness.

Furthermore, a portion of the substrate may be removed before forming another material thereon. However, the exposed surface after such removal operation may be rough, and such rough surface serving as the starting surface may aggravate the issue of misfit dislocation and/or threading dislocation, which may lead to undesired effect such as dark current.

The present disclosure provides a photo sensing device and method(s) for forming the photo sensing device in order to improve the device performance and mitigate the aforesaid issues (such as dark current). It should be noted that in the present disclosure, a germanium photosensitive layer forming on a silicon surface is used as an example. However, other suitable materials or compositions may also be used as a photosensitive layer or a substrate. For example, III-V group material (such as InGaAs, InP, etc.), other IV group material, or other combination/composition thereof may be other types of material that can be utilized as a photosensitive material in the application of photodetector. It should be noted that herein in the present disclosure, the term "starting surface" for epitaxial growth refers to a surface provided as an underlying surface for growing an epitaxial layer thereon, wherein the starting surface may be in direct contact with the epitaxial layer after growth operation.

FIG. 1 is a schematic drawing illustrating a cross sectional view of a photo sensing device, according to some embodiments of the present disclosure. A photo sensing device 100 at least includes a substrate 1 and a photosensitive member 3 formed over a first side FS of the substrate 1. The substrate 1 has a first semiconductor material at the first side FS. In some embodiments, the first semiconductor material is silicon and the substrate 1 is a silicon-on-insulator (SOI) substrate, that is, includes a silicon base layer 1a, an insulation layer 1b over the silicon base layer 1a, and a surface layer 1c over the insulation layer 1b. In some embodiments, the insulation layer 1b can be a buried oxide (BOX) layer. In some embodiments, the surface layer 1c includes silicon or intrinsic silicon. Alternatively in some other embodiments, the substrate 1 is a silicon bulk substrate (which allows the photosensitive member 3 to be disposed on a silicon layer at the surface) or other types of substrates suitable for being applied in the field of photo sensing device.

In some embodiments, the photosensitive member 3 includes a second semiconductor material different from the first semiconductor material. In some embodiments, the second semiconductor material is an epitaxial layer. In some embodiments, the second semiconductor material is germanium. In some embodiments, the photosensitive member 3 is made from intrinsic germanium. Alternatively in some other embodiments, the photosensitive member 3 includes other materials that can be utilized to absorb radiation, such as light, and further convert the radiation into electrical signal. It should be noted that a lattice constant of the first semiconductor material is different from a lattice constant of the second semiconductor material. For example, in the case of the first semiconductor material is silicon and the second semiconductor material is germanium, the difference thereof may be around 4.2% under certain circumstances.

A portion of the photosensitive member 3 is formed over a first region RA in the substrate 1. In some embodiments, the photosensitive member 3 extends into and is at least partially surrounded by the substrate 1. In some embodiments, a lower portion of the photosensitive member 3 is laterally surrounded by the surface layer 1c of the substrate 1, and an upper portion of the photosensitive member 3 protrudes from the first side FS of the substrate 1. The photosensitive member 3 may have a top surface 3TS, wherein the top surface 3TS of the upper portion of the photosensitive member 3 has a facet tapering toward the top surface 3TS.

Furthermore, a first portion 1z of the surface layer 1c directly under the photosensitive member 3 has a first thickness t1 less than a second thickness t2 of a second portion 1z* of the surface layer 1c surrounding the first portion 1z. The second portion 1z* of the surface layer 1c is over a second region RB and a third region RC, wherein the second region RB and the third region RC may be adjacent to the first region RA, the second region RB is at a first side of the first region RA and the third region RC is at a second side of the first region RA opposite to the first side. Alternatively stated, the surface layer 1c has an inner sidewall over a boundary between the first portion 1z and the second portion 1z*.

The photo sensing device 100 further includes a semiconductor stack 6 spacing between the photosensitive member 3 and the substrate 1. The semiconductor stack 6 at least interposing between a bottom surface of the photosensitive member 3 and a top surface of the first portion 1z of the surface layer 1c. The semiconductor stack 6 may further laterally surround an outer sidewall of the lower portion of the photosensitive member 3 and interposing between the outer sidewall of the photosensitive member 3 and an inner sidewall of the surface layer 1c facing toward the photosensitive member 3.

Figure 2A:
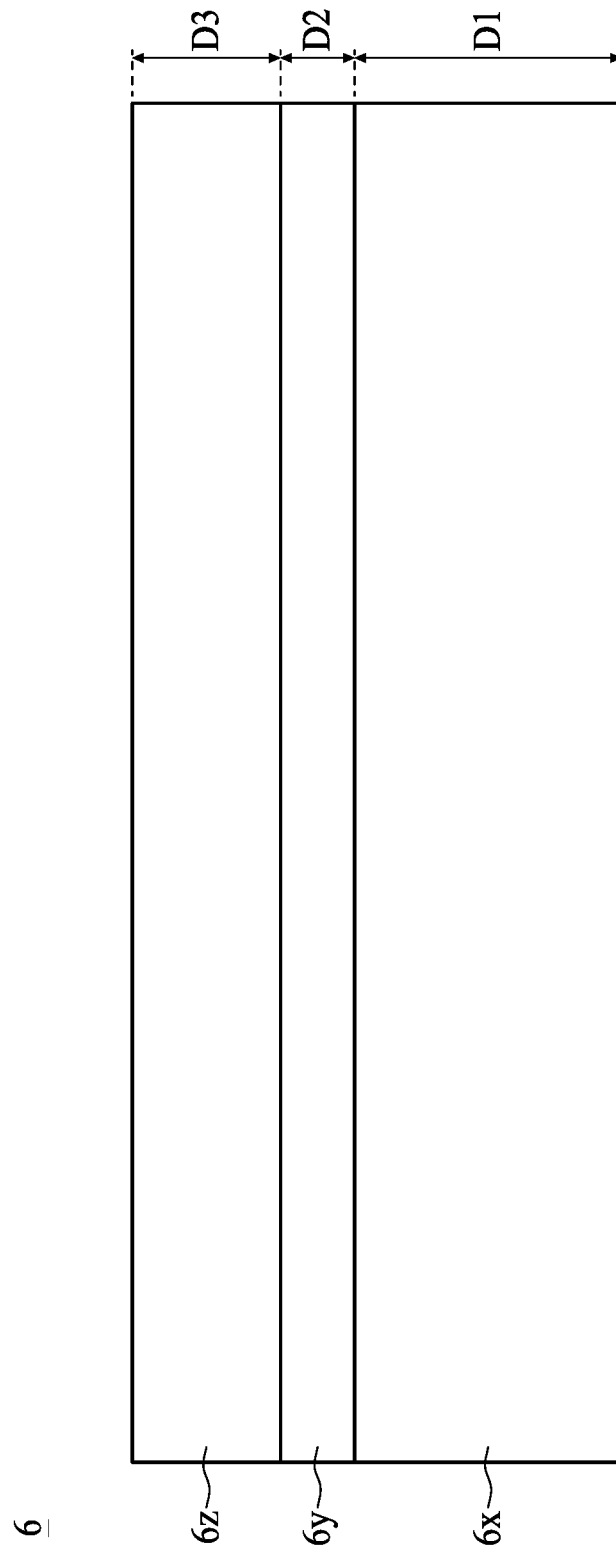
FIG. 2A is a schematic drawing illustrating an enlarged cross sectional view of a semiconductor stack of a photo sensing device along line U'-U' shown in FIG. 1, according to some embodiments of the present disclosure.
Figure 2B:
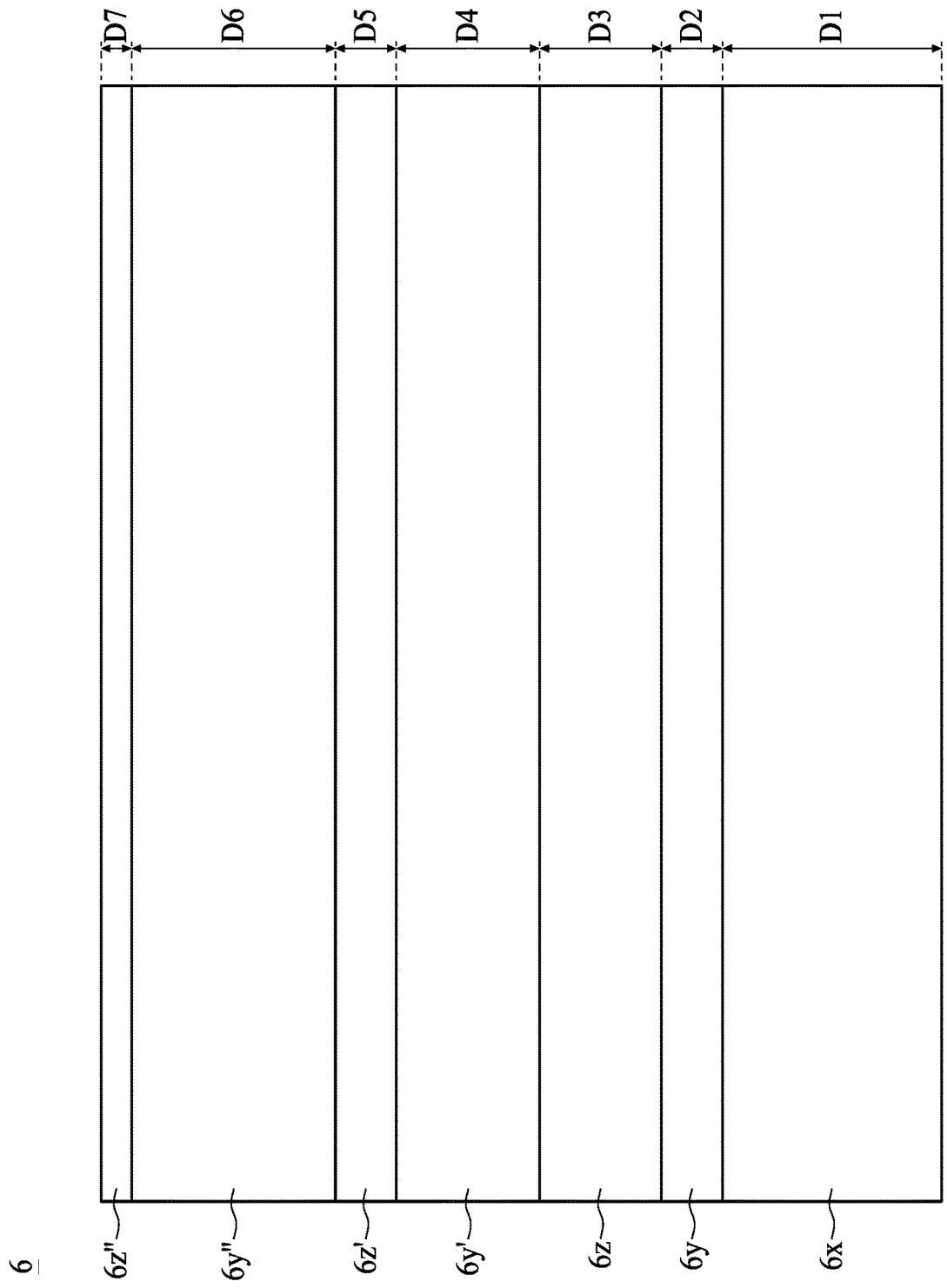
FIG. 2B is a schematic drawing illustrating an enlarged cross sectional view of a semiconductor stack of a photo sensing device along line U'-U' shown in FIG. 1, according to some embodiments of the present disclosure.

FIG. 2A is a schematic drawing illustrating an enlarged cross sectional view of a semiconductor stack of a photo sensing device along line U'-U' shown in FIG. 1, FIG. 2B is a schematic drawing illustrating an enlarged cross sectional view of a semiconductor stack of a photo sensing device along line U'-U' shown in FIG. 1, according to some embodiments of the present disclosure. In some embodiments, the semiconductor stack 6 is a composite layer that has a multilayer structure, such as examples illustrated in FIG. 2A or FIG. 2B. In some embodiments, the semiconductor stack 6 includes two or more semiconductor layers stacking over each other. For the example illustrated in FIG. 2A, the semiconductor stack 6 includes a first semiconductor layer 6x proximal to the surface layer 1c, a third semiconductor layer 6z proximal to the photosensitive member 3, and a second semiconductor layer 6y between the first semiconductor layer 6x and the third semiconductor layer 6z. The first semiconductor layer 6x and the third semiconductor layer 6z may have a material different from a material of the second semiconductor layer 6y. In some embodiments, the first semiconductor layer 6x and the third semiconductor layer 6z includes the first semiconductor material (identical or similar to the material of the substrate 1, for example, intrinsic silicon), the second semiconductor layer 6y includes the second semiconductor material (identical or similar to the material of the photosensitive member 3, for example, intrinsic germanium). A thickness D1 of the first semiconductor layer 6x is greater than a thickness D3 of the third semiconductor layer 6z. In some of the embodiments, a thickness D2 of the second semiconductor layer 6y is less than the thickness D1 of the first semiconductor layer 6x.

Alternatively stated, the semiconductor stack 6 includes a first semiconductor layer 6x having the first semiconductor material above the surface layer 1c and extending along the inner sidewall of the surface layer 1c, a second semiconductor layer 6y over a bottom portion of the first semiconductor layer 6x and laterally surrounded by an inner sidewall of the first semiconductor layer 6x, wherein the second semiconductor layer 6y has the second semiconductor material; and a third semiconductor layer 6z over a bottom portion of the second semiconductor layer 6y and laterally surrounded by an inner sidewall of the second semiconductor layer 6y, wherein the third semiconductor layer 6z has the first semiconductor material. The third semiconductor layer 6z may be in direct contact with the photosensitive member 3, and the first semiconductor layer 6x may be in direct contact with the first portion 1z of the surface layer 1c at an interface INT.

Generally speaking, since it is easier for a thinner layer to be compressed than a thicker layer, the lattice constant of a layer can be slightly altered based on a lattice constant of the underlying layer below. In some embodiments, the compression effect is more evident when a thickness of the semiconductor layer is thinner than 20 nm (or in some cases, thinner than 10 nm). Accordingly, by having an alternating stack of the first semiconductor material and the second semiconductor material, the layer configured to have the photosensitive member 3 grew thereon (the third semiconductor layer 6z in the example of FIG. 2A) has a lattice constant closer to the second semiconductor material of the photosensitive member 3 (such as germanium), comparing to a lattice constant difference between the photosensitive member 3 and the first portion 1z of the surface layer 1c, which is relatively distal from the photosensitive member 3.

In addition, by having the thickness D3 of the third semiconductor layer 6z less than the thickness D1 of the first semiconductor layer 6x, an effective lattice constant of the third semiconductor layer 6z may further be relatively closer to an effective lattice constant of the second semiconductor layer 6y. For example, in the case of the photosensitive member 3 is an intrinsic germanium layer having a width from about 350 nm to about 500 nm and a height from about 400 nm to about 500 nm, the thickness D1 of the first semiconductor layer 6x over the first portion 1z of the surface layer 1c is in a range from about 8 nm to about 10 nm, the thickness D2 of the second semiconductor layer 6y is around 2.0 nm, and the thickness D3 of the third semiconductor layer 6z is in a range from about 3.0 nm to around 5.0 nm.

Furthermore, by having more layers alternately stacked, the lattice mismatch can be gradually and effectively reduced. That is, the semiconductor stack 6 includes two or more layers of the first semiconductor material and two or more layers of the second semiconductor material alternately stacked. Furthermore, with regard to the layers having the first semiconductor material (such as silicon) in the semiconductor stack 6, a layer closer to the interface INT is thicker than a layer closer to the photosensitive member 3. In contrast, with regard to the layers having the second semiconductor material (such as germanium) in the semiconductor stack 6, a layer closer to the photosensitive member 3 is thicker than a layer closer to the interface INT.

In the example shown in FIG. 2B, a semiconductor stack 6 having seven layers is provided (four layers including the first semiconductor and three layers including the second semiconductor alternatively stacked). Each of the layers, starting from the one proximal to the interface INT, are sequentially denoted as a first semiconductor layer 6x, a second semiconductor layer 6y, a third semiconductor layer 6z, a fourth semiconductor layer 6y', a fifth semiconductor layer 6z', a sixth semiconductor layer 6y", and a seventh semiconductor layer 6z", which is proximal to the photosensitive member 3. However, it should be noted that the number of layers in the semiconductor stack 6 can be adjusted based on the thickness of the photosensitive member 3 to be formed, a material of the photosensitive member 3, et cetera. In some embodiments, the semiconductor layer of the semiconductor stack 6 in direct contact with the photosensitive member 3 and the semiconductor layer of the semiconductor stack 6 in direct contact with the first portion 1z have identical material.

For example, in the case of the photosensitive member 3 is an intrinsic germanium layer having a width from about 350 nm to about 500 nm and a height from about 400 nm to about 500 nm, the thickness D1 of the first semiconductor layer 6x is in a range from about 8 nm to about 10 nm, the thickness D3 of the third semiconductor layer 6z in a range from about 4 nm to about 5 nm, the thickness D5 of the fifth semiconductor layer 6z' about 2 nm, the thickness D7 of the seventh semiconductor layer 6z" is less than 2 nm; the thickness D2 of the second semiconductor layer 6y is about 2 nm, the thickness D4 of the fourth semiconductor layer 6y' is in a range from about 4 nm to about 5 nm, the thickness D6 of the sixth semiconductor layer 6y" is in a range from about 8 nm to about 10 nm. That is, D1>D3>D5>D7 and D6>D4 >D2. Optionally, the semiconductor layer having the second semiconductor material being closest to the photosensitive member 3 may be thicker than the semiconductor layer having the first semiconductor material being the closest to the photosensitive member 3 (e.g. D6>D7), wherein the relationship may be predetermined based on the total number of layers in the semiconductor stack 6.

Comparing to a comparative embodiment of having a photosensitive member directly disposed on a substrate, with the configuration of the semiconductor stack 6 between the photosensitive member 3 and the substrate 1 in the present disclosure, the lattice mismatch between the photosensitive member 3 and the semiconductor layer of the semiconductor stack 6 in direct contact with the photosensitive member 3 may be effectively reduced. For example, a top surface of the semiconductor stack 6 for epitaxially growing the photosensitive member 3 has a lattice constant closer to the material of the photosensitive member 3, for example, intrinsic germanium.

In some embodiments, doped regions can be formed in the substrate 1 in order to create electrical properties. For example, a first doped region DR1 having a first conductivity type (for example, p-type) is formed over the second region RB and adjacent to the photosensitive member 3. A second doped region DR2 having a second conductivity type different from the first conductivity type (for example, n-type) is formed over the third region RC opposite to the second region RB with regard to the photosensitive member 3, and adjacent to the photosensitive member 3. In some embodiments, the first doped region DR1 includes a lightly doped region DR1-L (wherein the concentration of the dopant can be referred as p+ in some examples) proximal to the photosensitive member 3 and a heavily doped region DR1-H (wherein the concentration of the dopant can be referred as p++ in some examples) adjacent to the lightly doped region DR1-L. In some embodiments, the second doped region DR2 includes a lightly doped region DR2-L (wherein the concentration of the dopant can be referred as n+ in some examples) proximal to the photosensitive member 3 and a heavily doped region DR2-H (wherein the concentration of the dopant can be referred as n++ in some examples) adjacent to the lightly doped region DR2-L.

Optionally, a third doped region DR1* having the first conductivity type can be formed in the photosensitive member 3 at a side adjacent to the lightly doped region DR1-L. In some embodiments, the third doped region DR1* may further include a portion of the first portion 1z of the surface layer 1c and a portion 6-1* of the semiconductor stack 6 (e.g. a portion of the semiconductor stack 6 extending along the inner sidewall of the surface layer 1c) adjacent to the lightly doped region DR1-L. Optionally, a fourth doped region DR2* having the second conductivity type can be formed in the photosensitive member 3 at a side adjacent to the lightly doped region DR2-L. In some embodiments, the fourth doped region DR2* may further include a portion of the first portion 1z of the surface layer 1c and a portion 6-2* of the semiconductor stack 6 (e.g. a portion of the semiconductor stack 6 extending along the inner sidewall of the surface layer 1c) adjacent to the lightly doped region DR2-L.

The photo sensing device 100 may further include an insulation layer 10 over the surface layer 1c of the substrate 1. In some embodiments, a portion of the photosensitive member 3 may protrude from the insulation layer 10. In some embodiments, the insulation layer 10 is an oxide layer. A silicide layer 11 may be formed in the insulation layer 10 and above the heavily doped regions DR1-H and DR2-H. A capping layer 20 may be formed above the insulation layer 10 and the top surface 3TS of the photosensitive member 3. The capping layer 20 may include insulation materials, such as silicon nitride (SiN) or oxide. In some alternative embodiments, the insulation layer 10 may also cover the top surface 3TS of the photosensitive member 3. A plurality of conductive contacts 21 may be formed in the capping layer 20 and respectively electrically connected to the silicide layer 11. In some embodiments, the conductive contacts 21 include metal. In some embodiments, the conductive contacts 21 may be directly above the heavily doped regions DR1-H and DR2-H. In some embodiments, the conductive contacts 21 may have a top surface coplanar with a top surface of the capping layer 20.

Figure 3A:
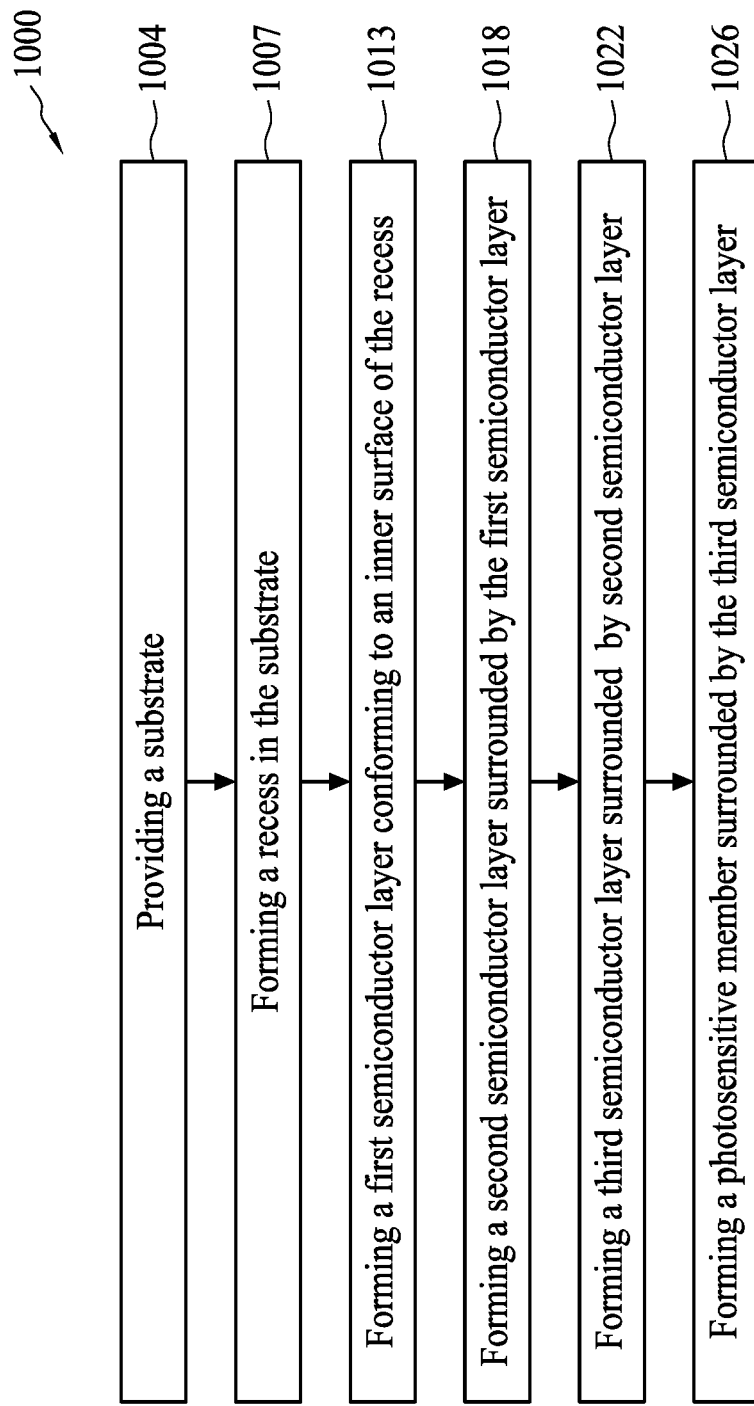
FIG. 3A shows a flow chart representing a method for fabricating a photo sensing device, in accordance with some embodiments of the present disclosure.

FIG. 3A shows a flow chart representing a method for fabricating a photo sensing device, in accordance with some embodiments of the present disclosure. The method 1000 for fabricating a photo sensing device includes providing a substrate (operation 1004, which can be referred to FIG. 4), forming a recess in the substrate (operation 1007, which can be referred to FIG. 5M or FIG. 6B), forming a first semiconductor layer conforming to an inner surface of the recess (operation 1013, which can be referred to FIG. 5R or FIG. 6E), forming a second semiconductor layer surrounded by the first semiconductor layer (operation 1018, which can be referred to FIG. 5S or FIG. 6E), forming a third semiconductor layer surrounded by second semiconductor layer (operation 1022, which can be referred to FIG. 5T or FIG. 6E), and forming a photosensitive member surrounded by the third semiconductor layer (operation 1026, which can be referred to FIG. 5U or FIG. 6E).

Figure 3B:
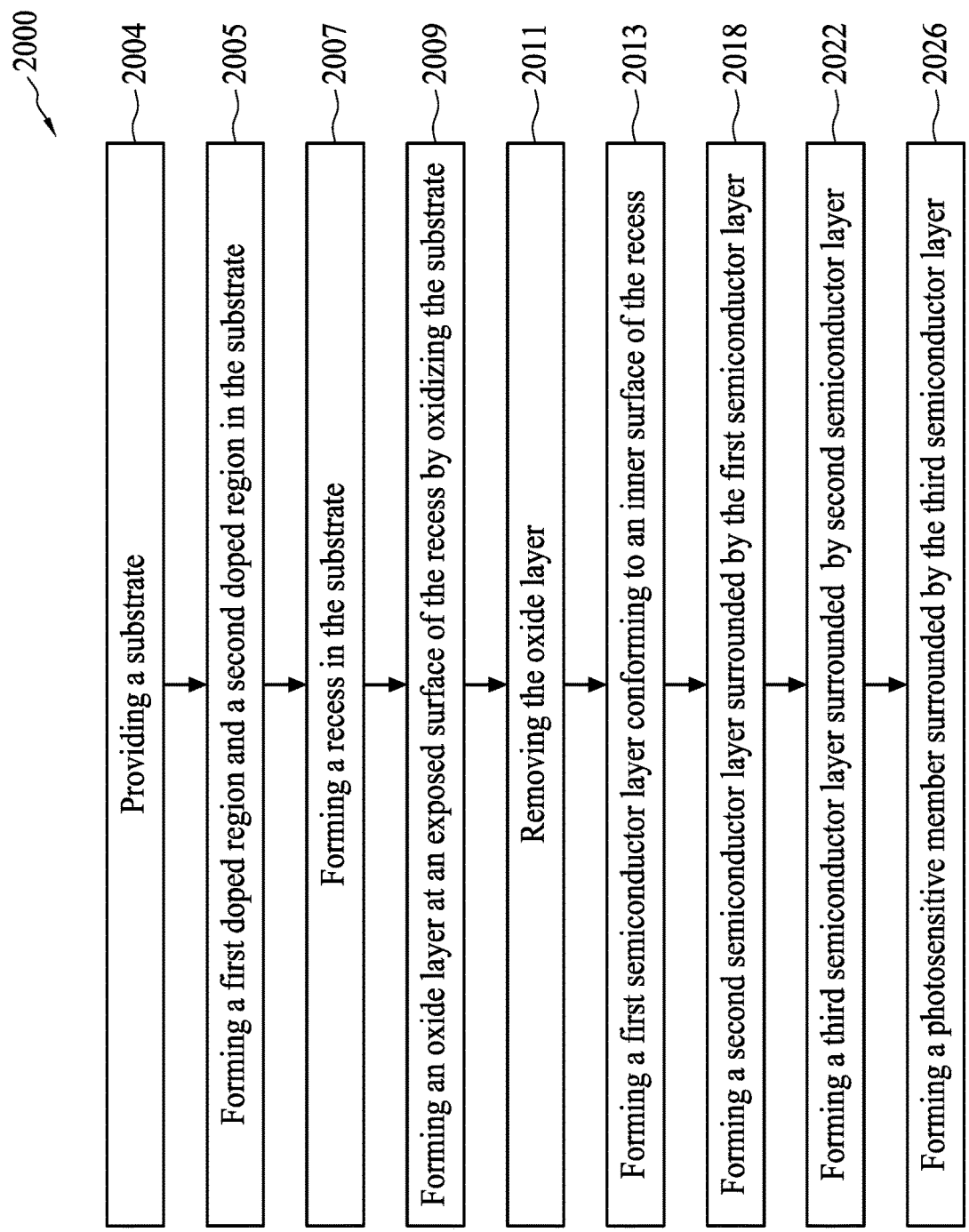
FIG. 3B shows a flow chart representing a method for fabricating a photo sensing device, in accordance with some embodiments of the present disclosure.

FIG. 3B shows a flow chart representing a method for fabricating a photo sensing device, in accordance with some embodiments of the present disclosure. The method 2000 for fabricating a photo sensing device includes providing a substrate (operation 2004, which can be referred to FIG. 4), forming a first doped region and a second doped region in the substrate (operation 2005, which can be referred to FIG. 5A to FIG. 5H), forming a recess in the substrate (operation 2007, which can be referred to FIG. 5M), forming an oxide layer at an exposed surface of the recess by oxidizing the substrate (operation 2009, which can be referred to FIG. 5N), removing the oxide layer (operation 2011, which can be referred to FIG. 5O), forming a first semiconductor layer conforming to an inner surface of the recess (operation 2013, which can be referred to FIG. 5R), forming a second semiconductor layer surrounded by the first semiconductor layer (operation 2018, which can be referred to FIG. 5S), forming a third semiconductor layer surrounded by second semiconductor layer (operation 2022, which can be referred to FIG. 5T), and forming a photosensitive member surrounded by the third semiconductor layer (operation 2026, which can be referred to FIG. 5U).

Figure 3C:
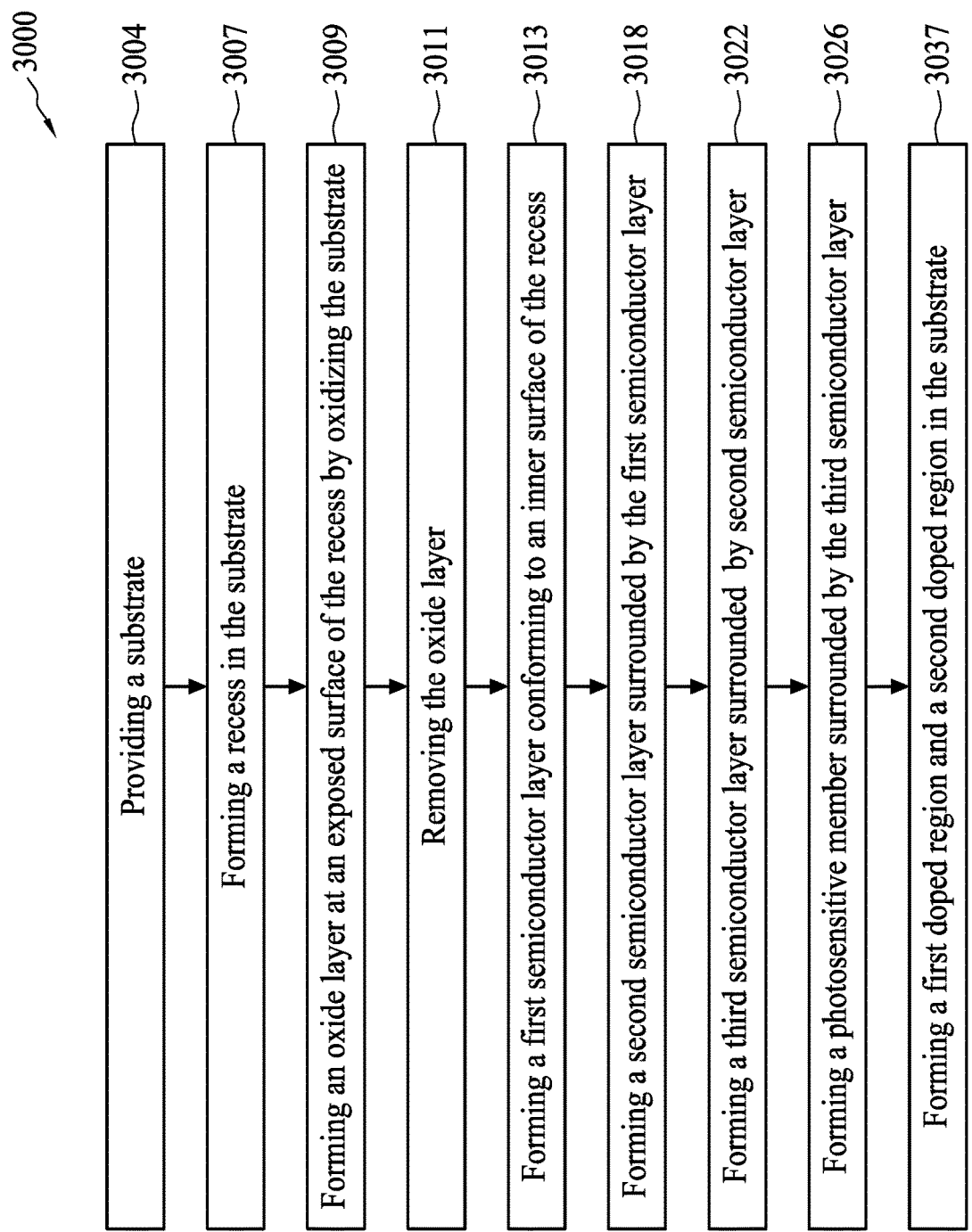
FIG. 3C shows a flow chart representing a method for fabricating a photo sensing device, in accordance with some embodiments of the present disclosure.

FIG. 3C shows a flow chart representing a method for fabricating a photo sensing device, in accordance with some embodiments of the present disclosure. The method 3000 for fabricating a photo sensing device includes providing a substrate (operation 3004, which can be referred to FIG. 4), forming a recess in the substrate (operation 3007, which can be referred to FIG. 6B), forming an oxide layer at an exposed surface of the recess by oxidizing the substrate (operation 3009, which can be referred to FIG. 6C), removing the oxide layer (operation 3011, which can be referred to FIG. 6D), forming a first semiconductor layer conforming to an inner surface of the recess (operation 3013, which can be referred to FIG. 6E), forming a second semiconductor layer surrounded by the first semiconductor layer (operation 3018, which can be referred to FIG. 6E), forming a third semiconductor layer surrounded by second semiconductor layer (operation 3022, which can be referred to FIG. 6E), forming a photosensitive member surrounded by the third semiconductor layer (operation 3026, which can be referred to FIG. 6E), and forming a first doped region and a second doped region in the substrate (operation 3037, which can be referred to FIG. 6F).

Figure 4:
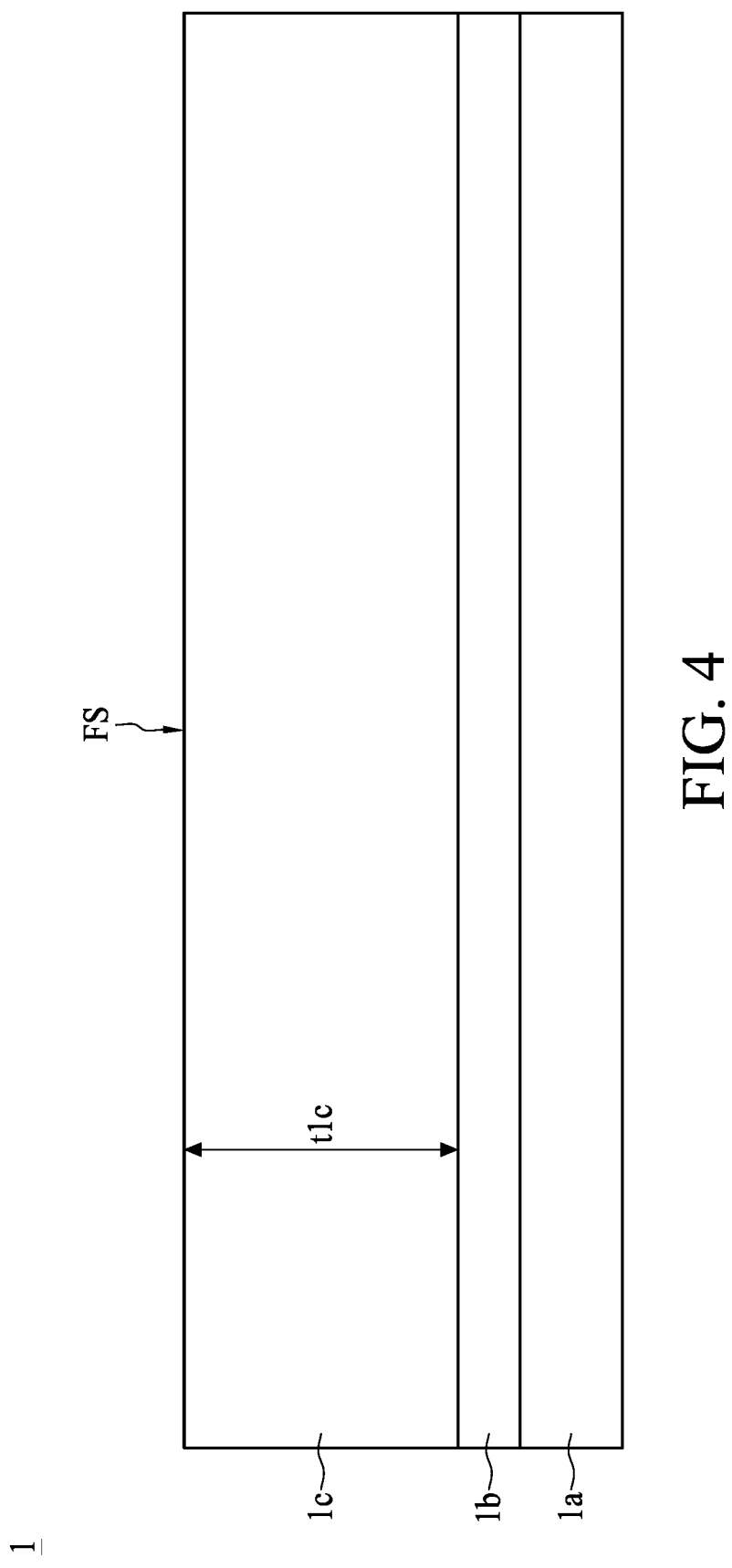
FIG. 4 is a cross sectional view of a photo sensing device during intermediate stages of manufacturing operations, according to some embodiments of the present disclosure.

FIG. 4 is a cross sectional view of a photo sensing device during intermediate stages of manufacturing operations, according to some embodiments of the present disclosure. A substrate 1 is provided. In some embodiments, the substrate 1 is a silicon-on-insulator (SOI) substrate, wherein the substrate 1 includes a silicon base layer 1a, an insulation layer 1b over the silicon base layer 1a, and a surface layer 1c over the insulation layer 1b. In some embodiments, the insulation layer 1b can be a buried oxide (BOX) layer. The surface layer 1c may include intrinsic silicon or silicon, and the substrate 1 has a first side FS at an exposed surface of the surface layer 1c.

Figure 5A:
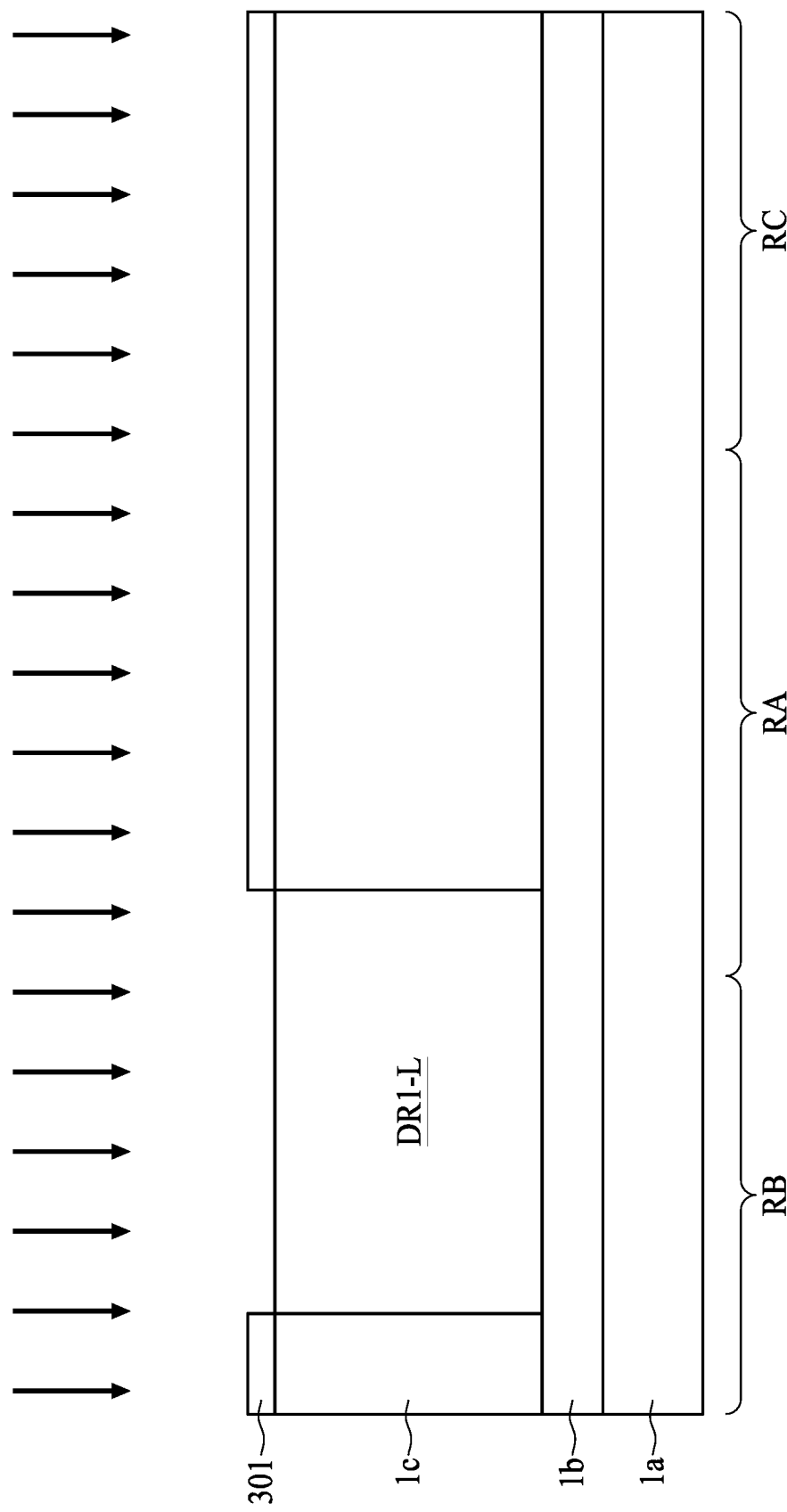
FIG. 5A to FIG. 5U are cross sectional views of a photo sensing device during intermediate stages of manufacturing operations, according to some embodiments of the present disclosure.
Figure 5B:
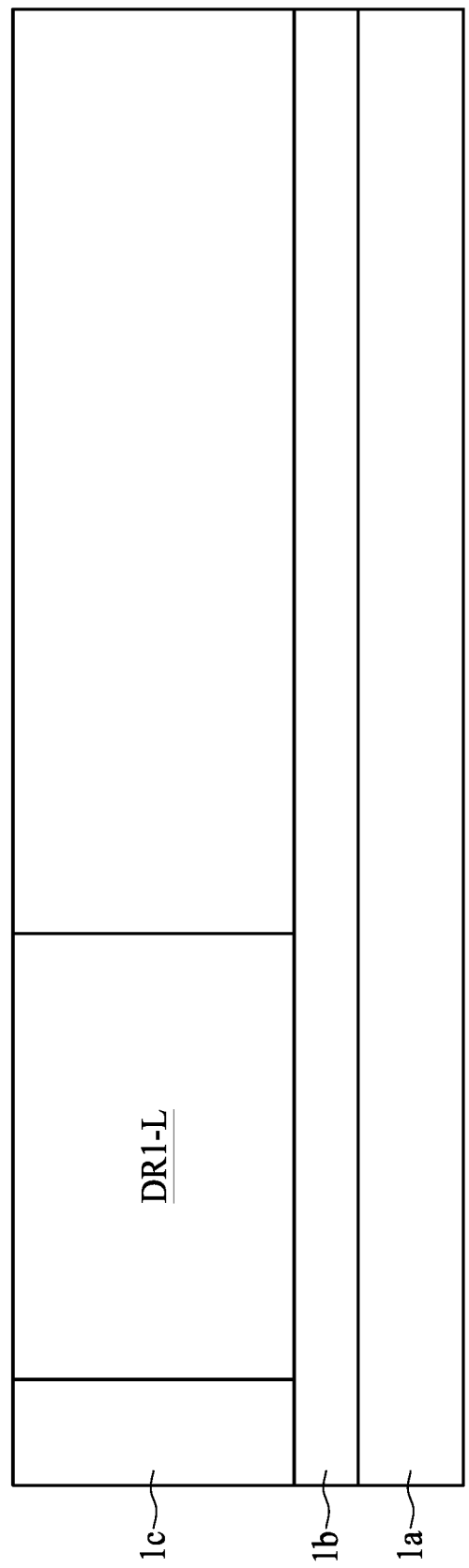
Figure 5C:
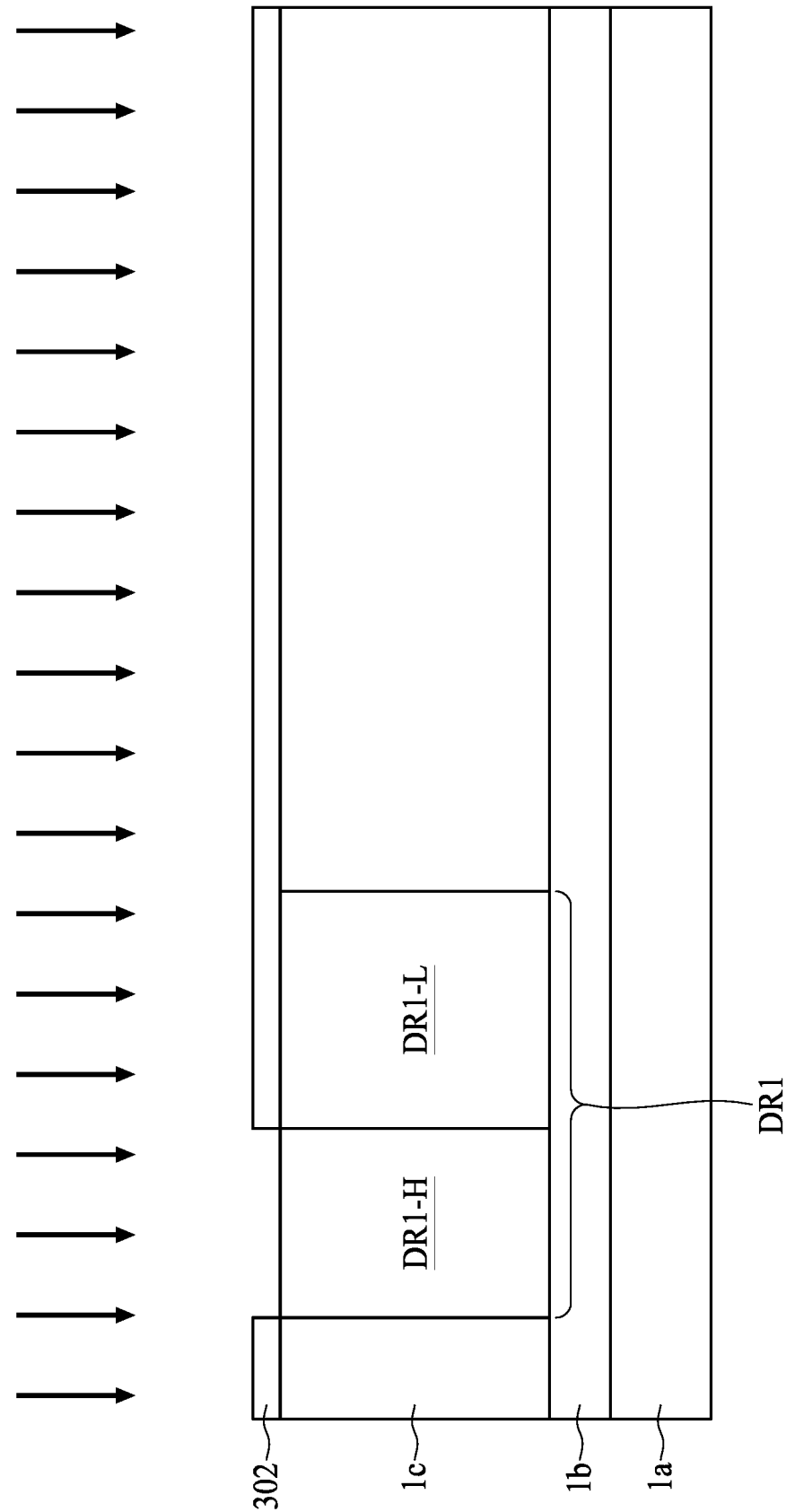
Figure 5D:
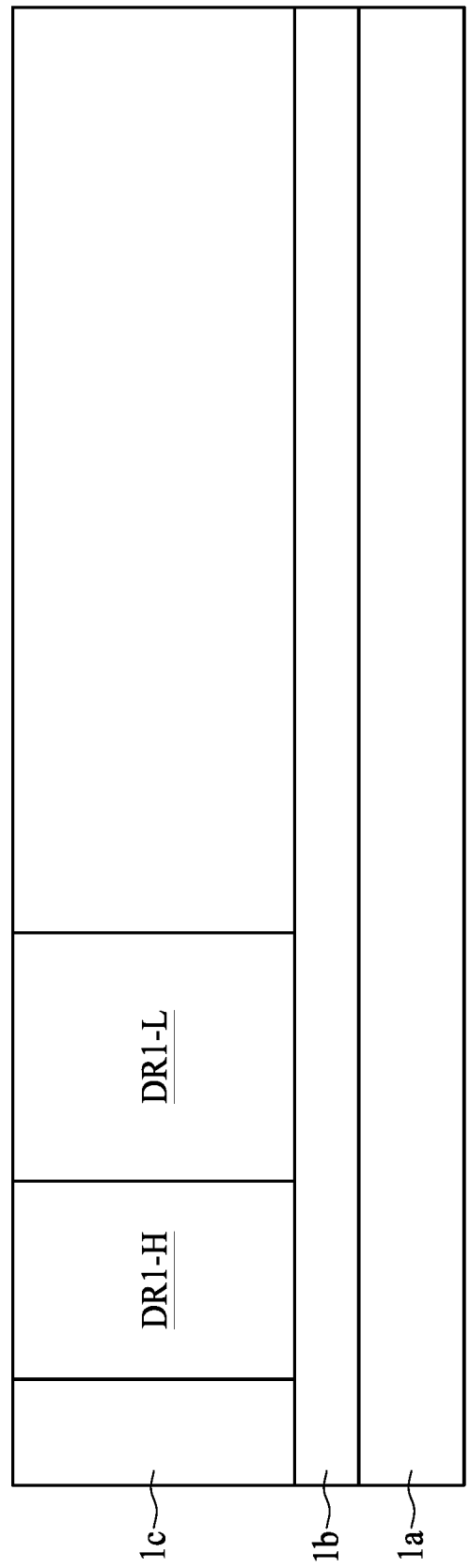
Figure 5E:
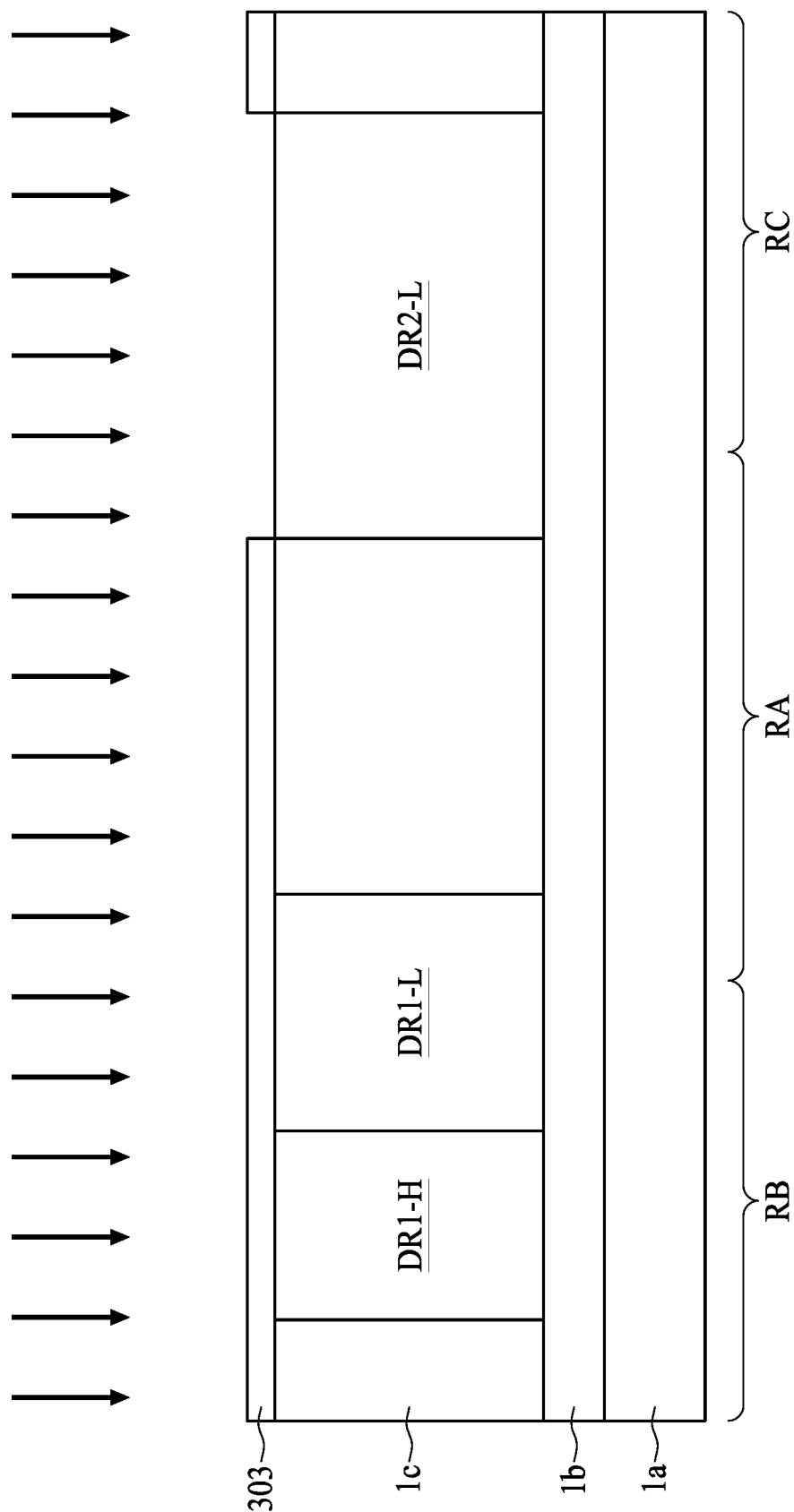
Figure 5F:
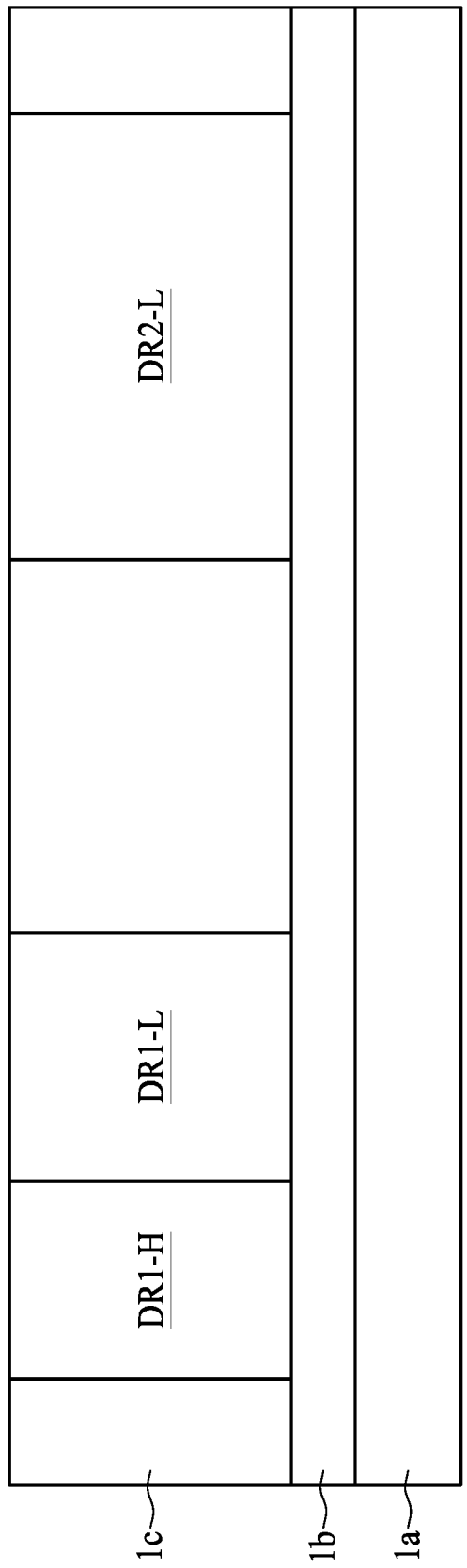
Figure 5G:
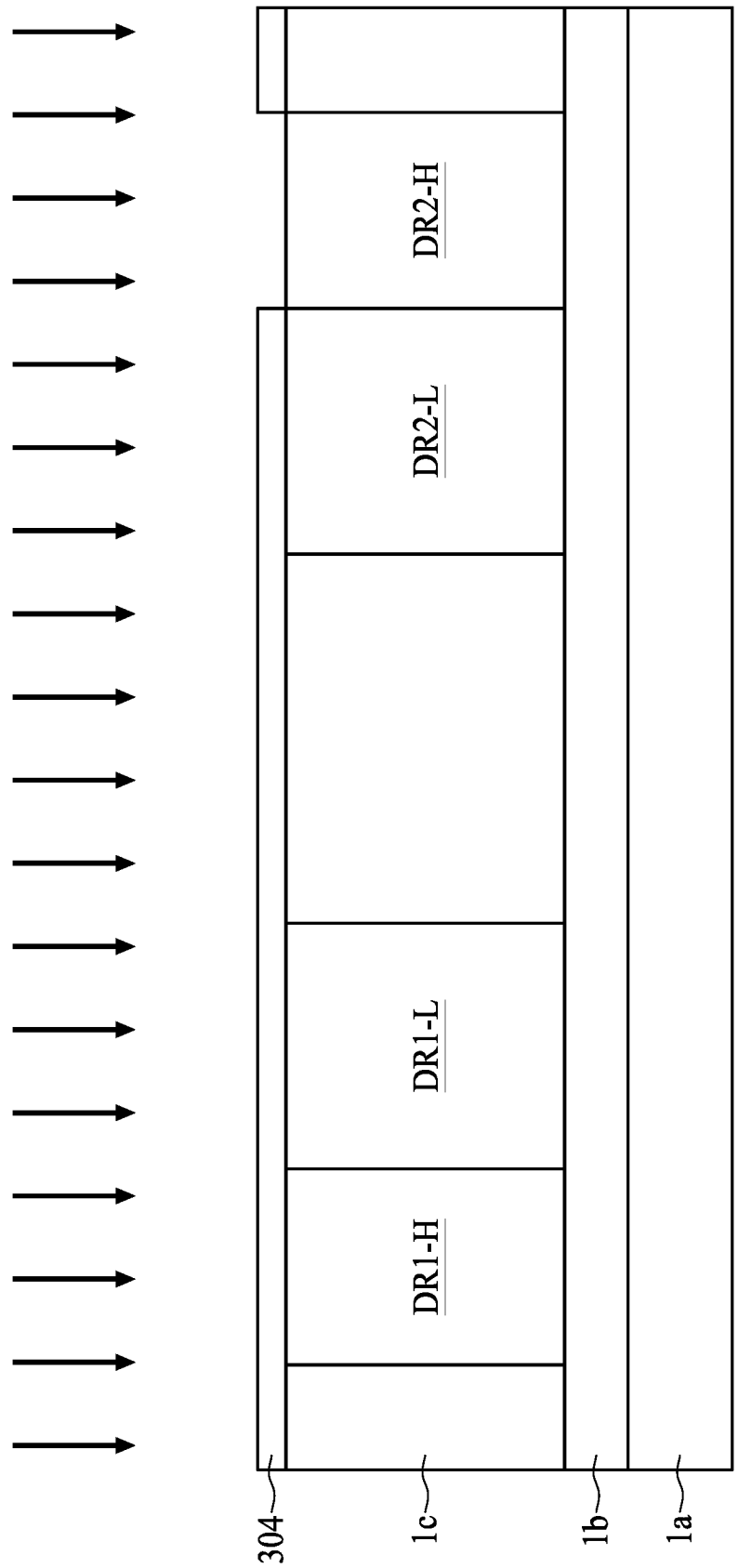
Figure 5H:
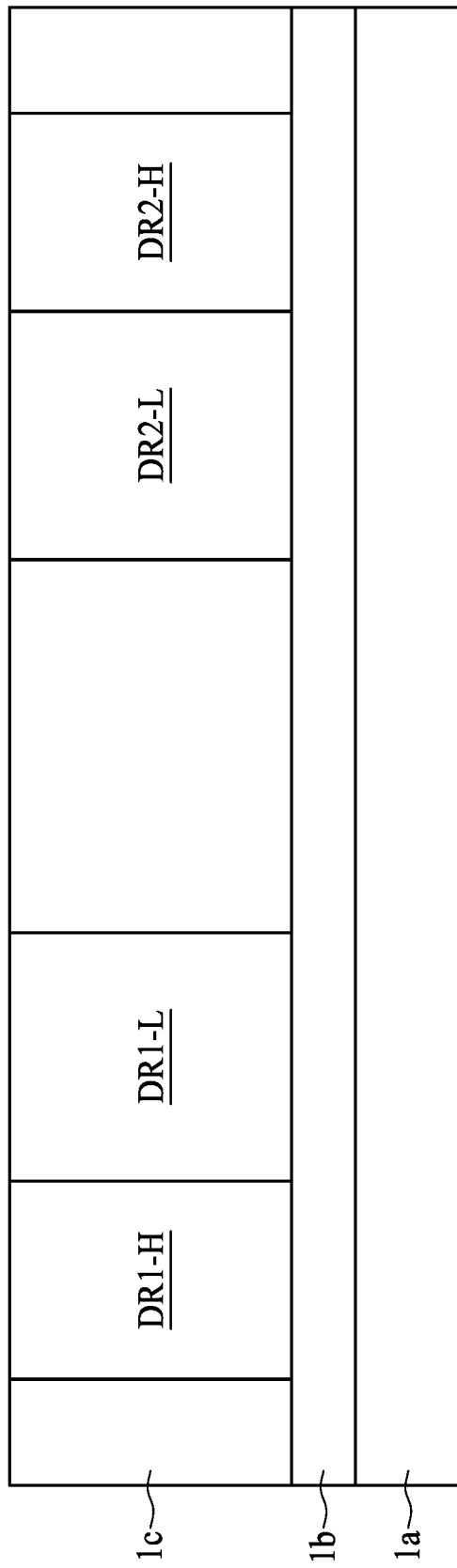
Figure 5I:
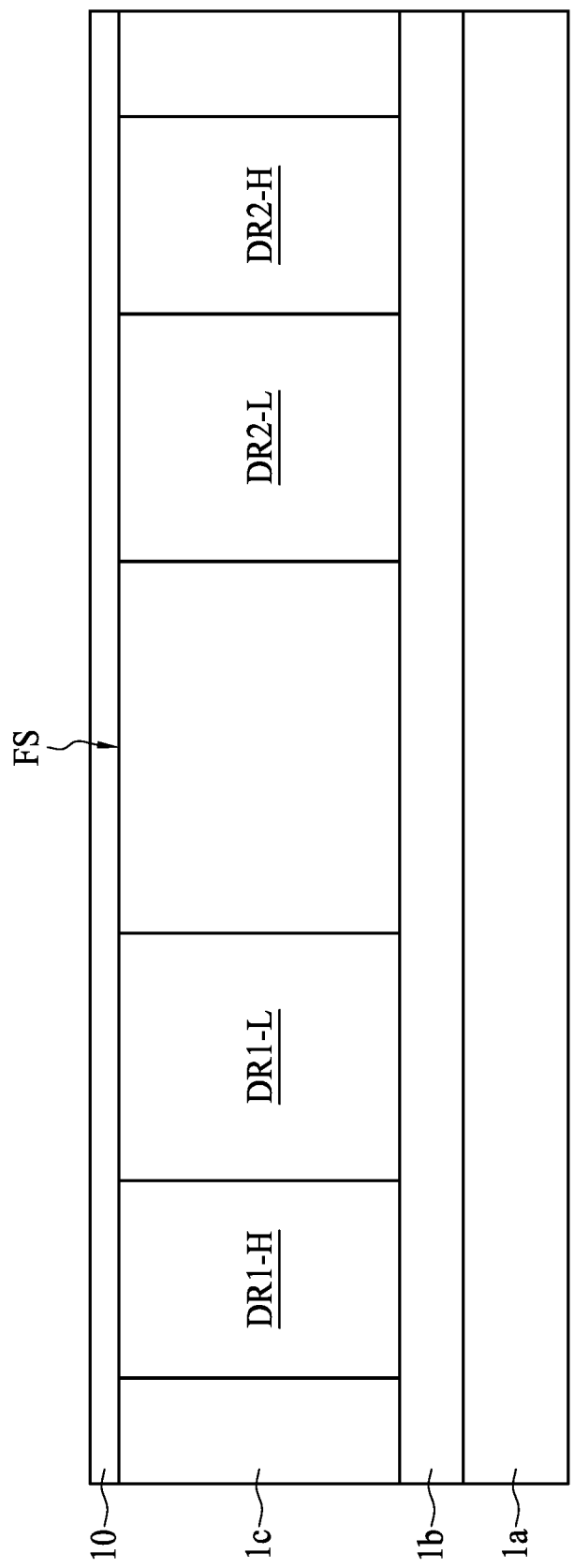
Figure 5J:
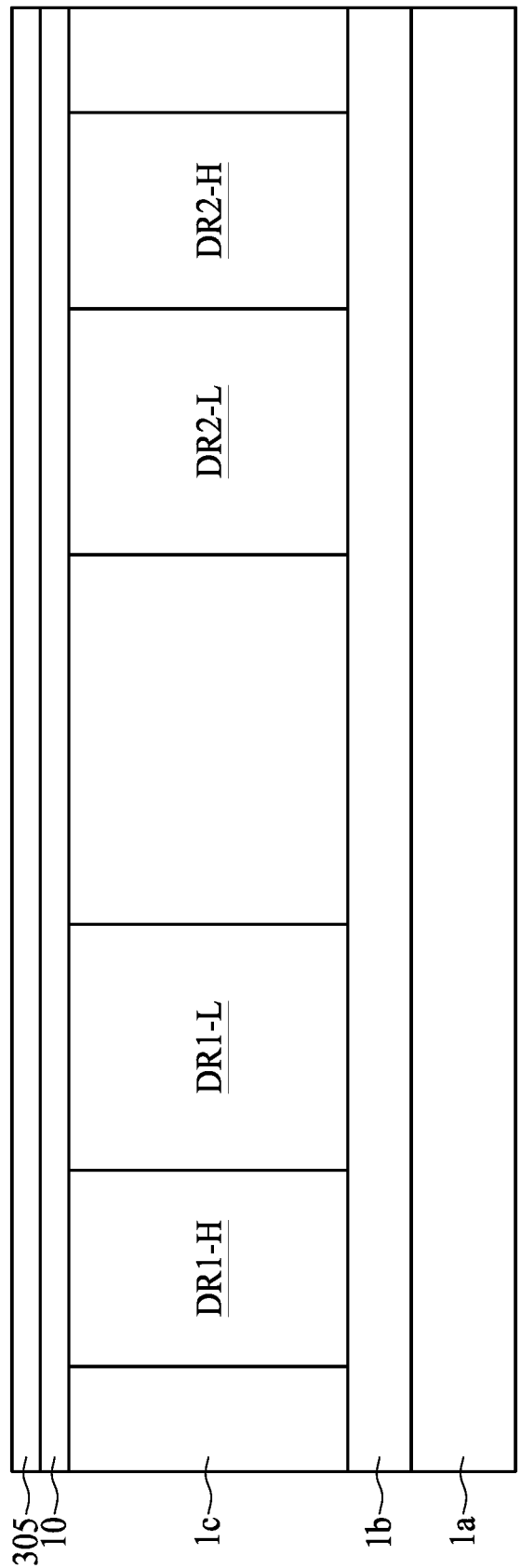
Figure 5K:
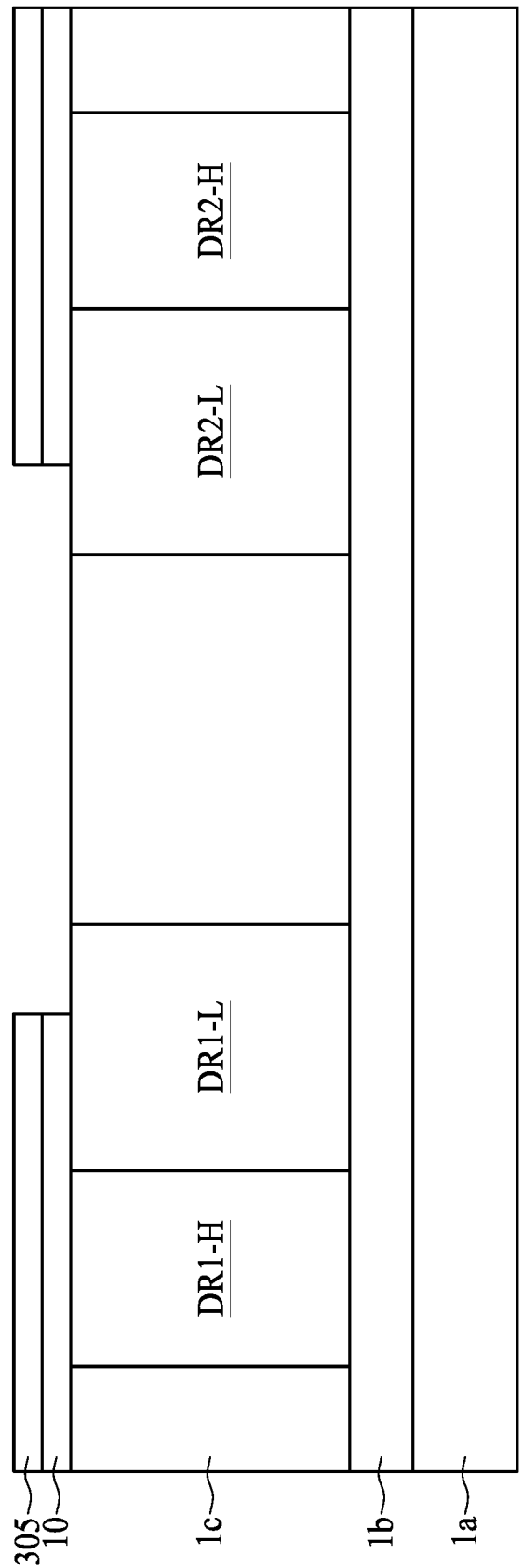
Figure 5L:
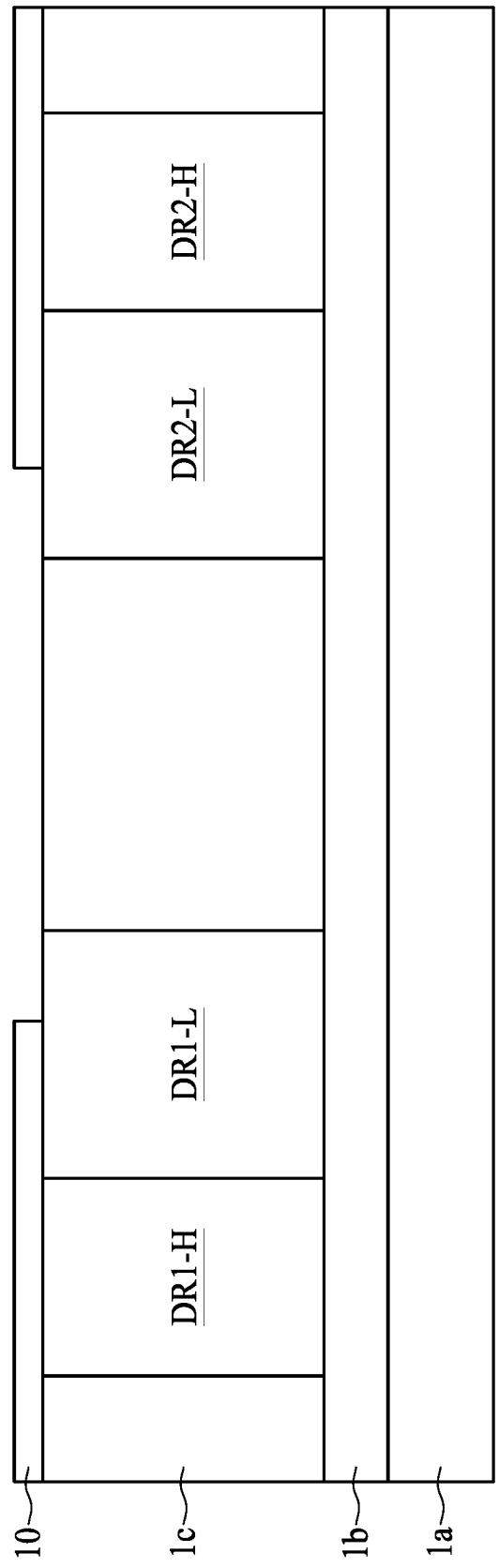
Figure 5M:
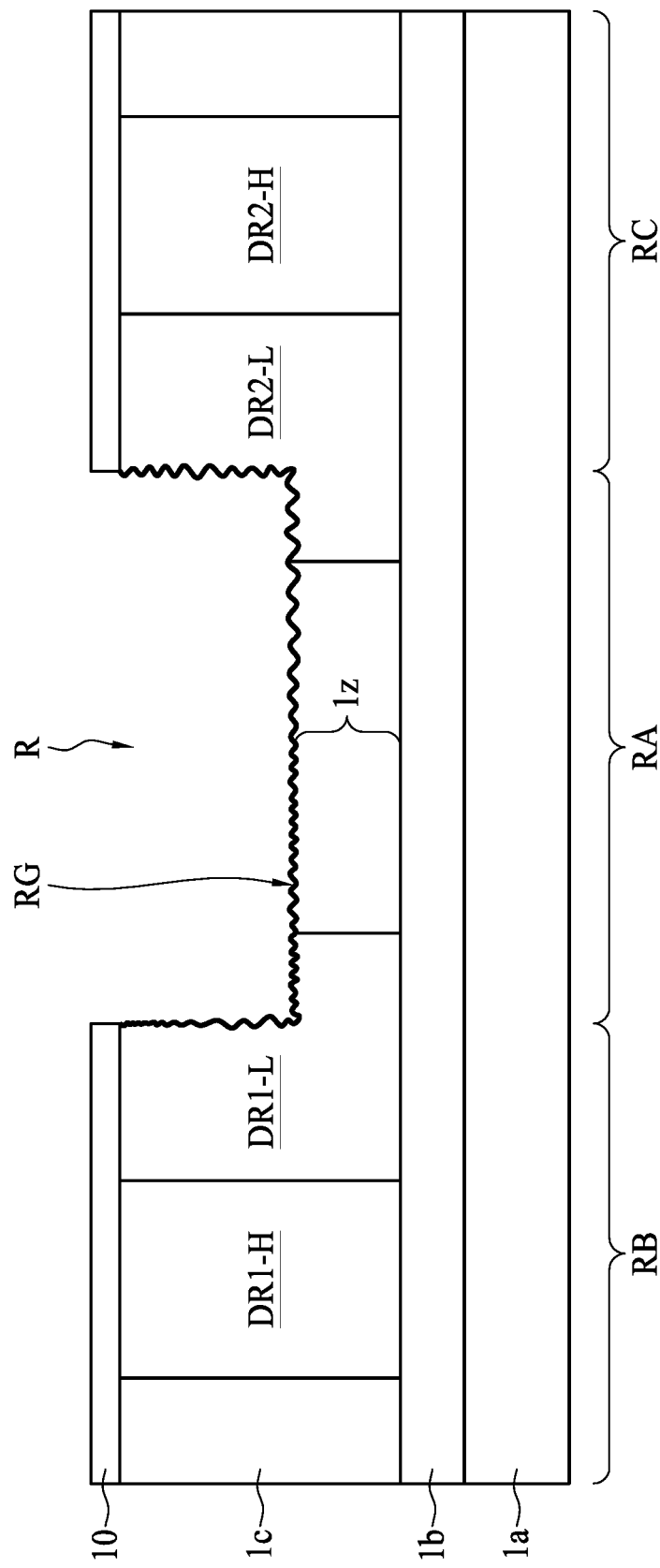
Figure 5N:
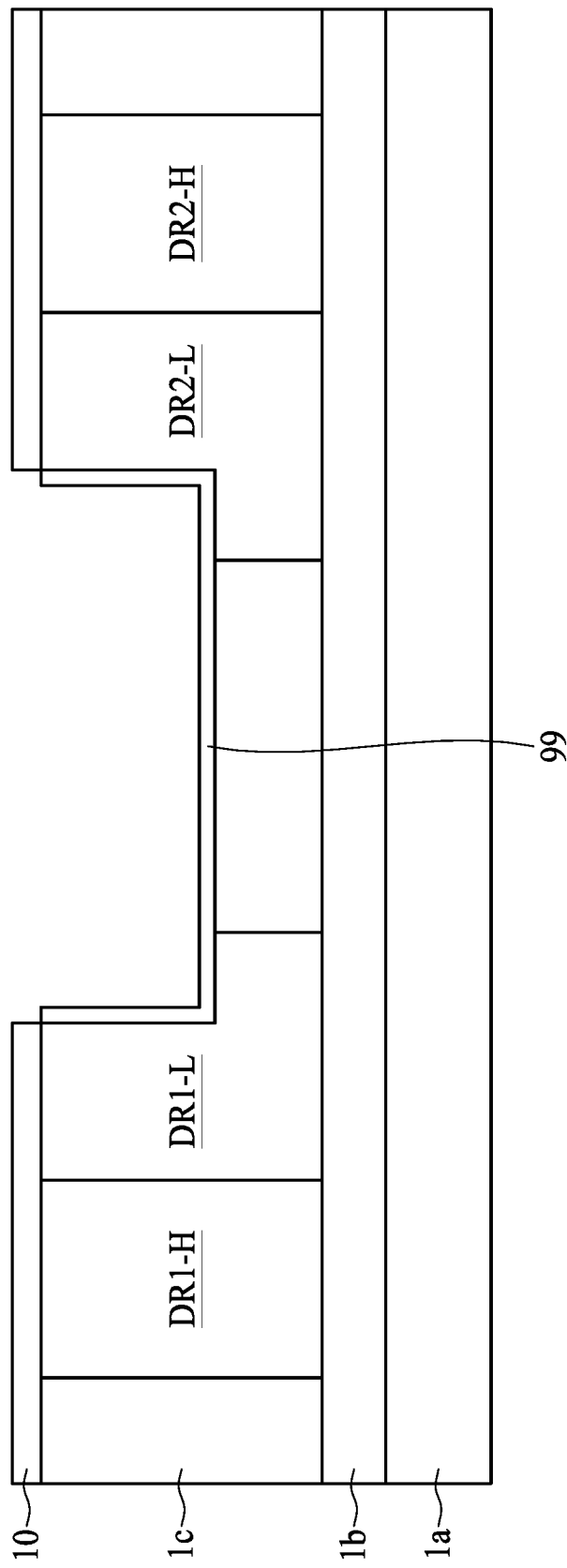
Figure 5O:
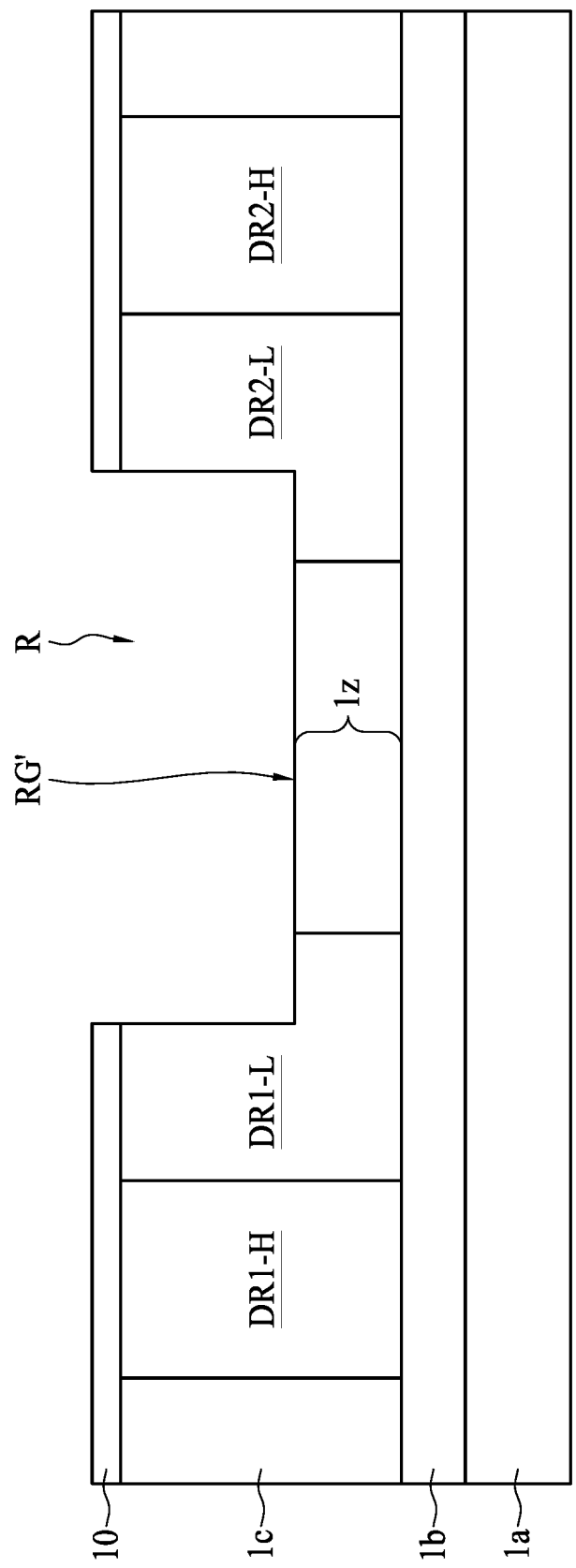
Figure 5P:
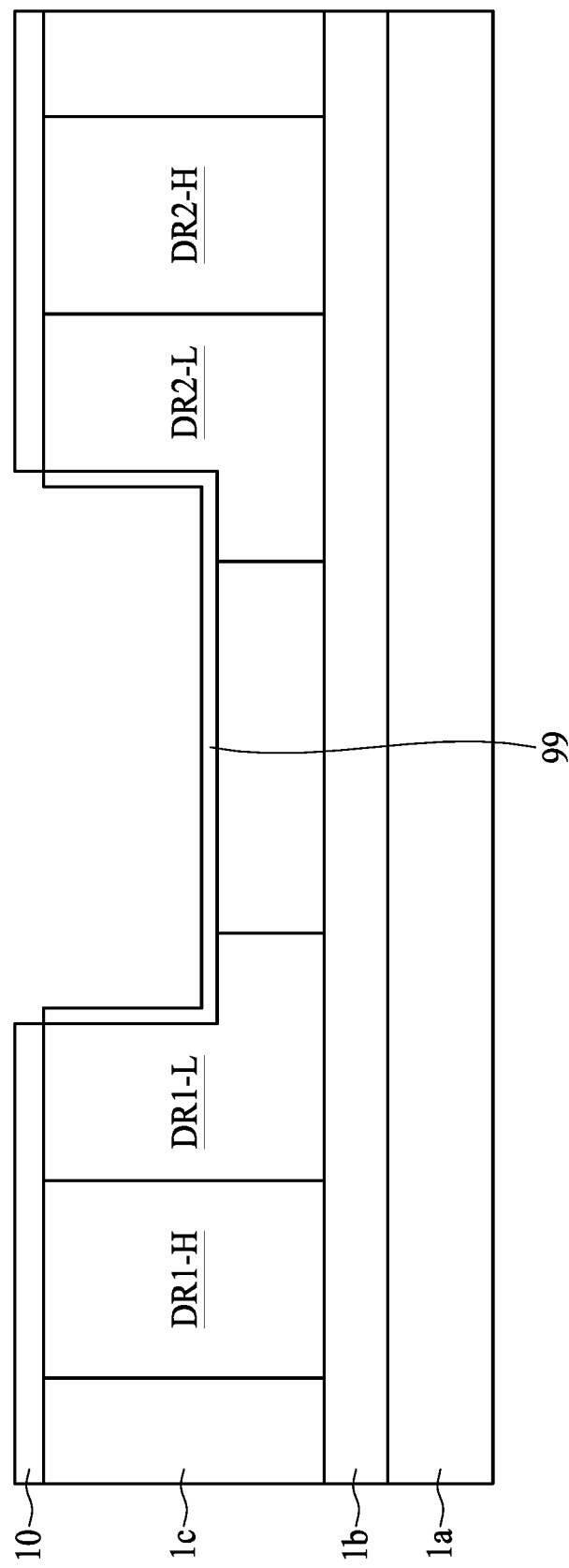
Figure 5Q:
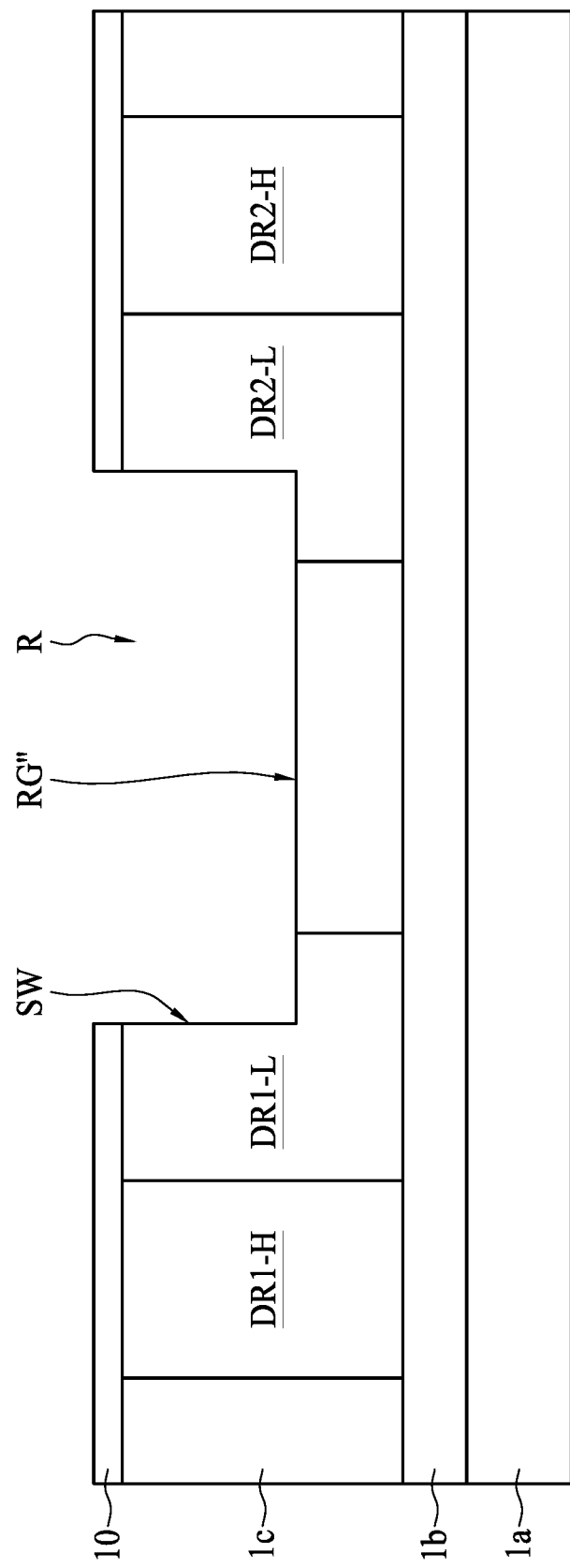
Figure 5R:
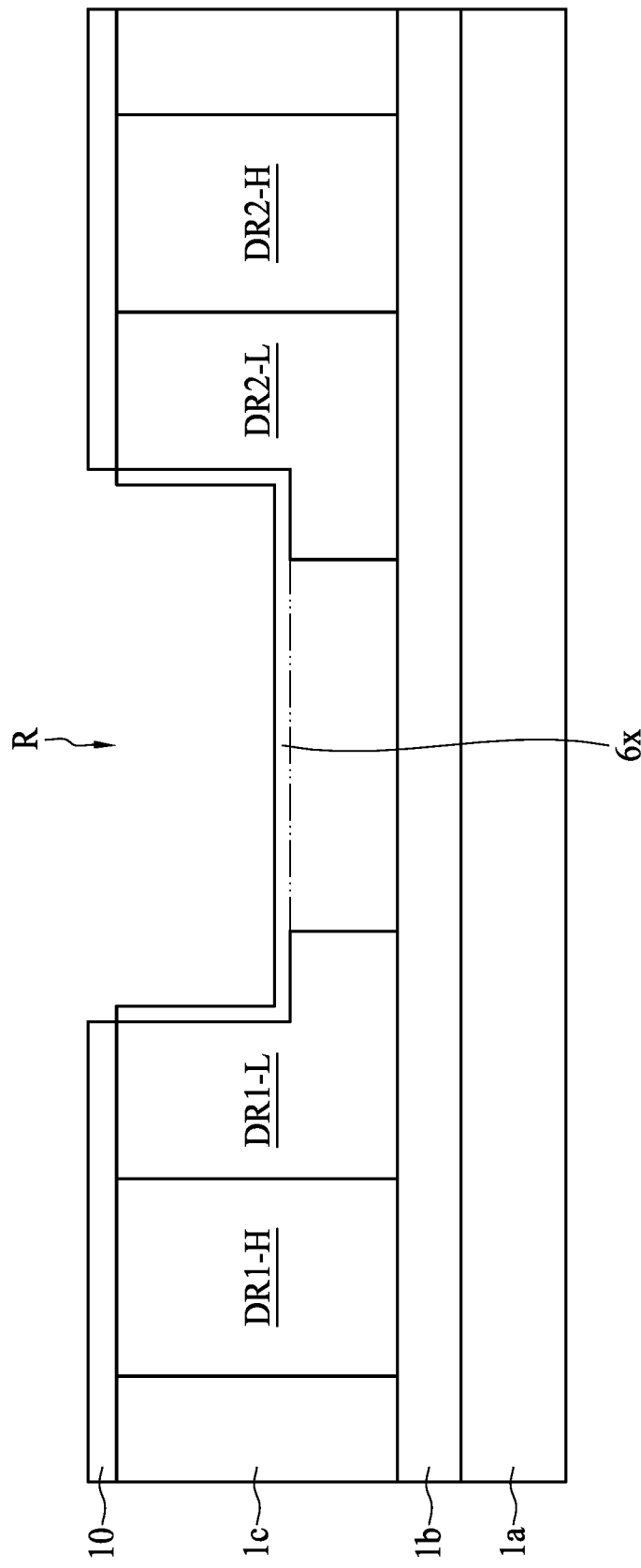
Figure 5S:
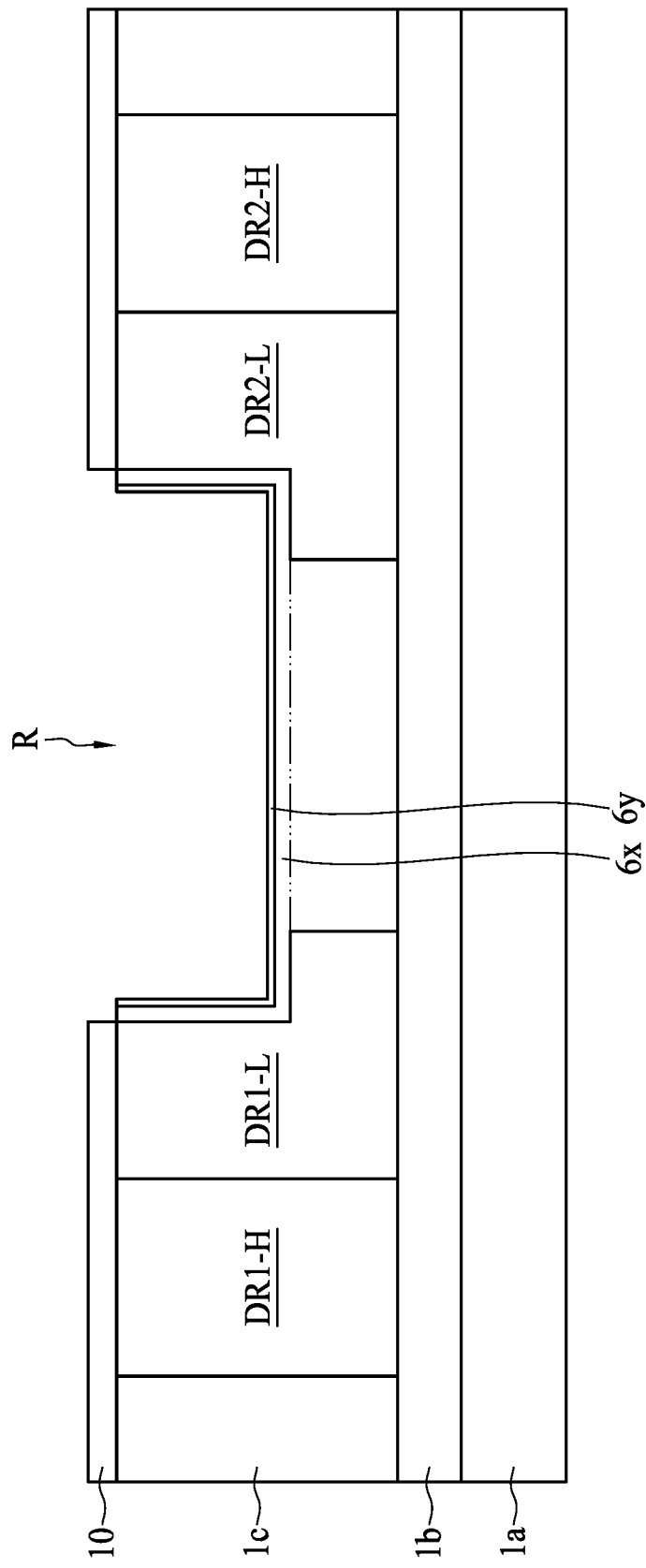
Figure 5T:
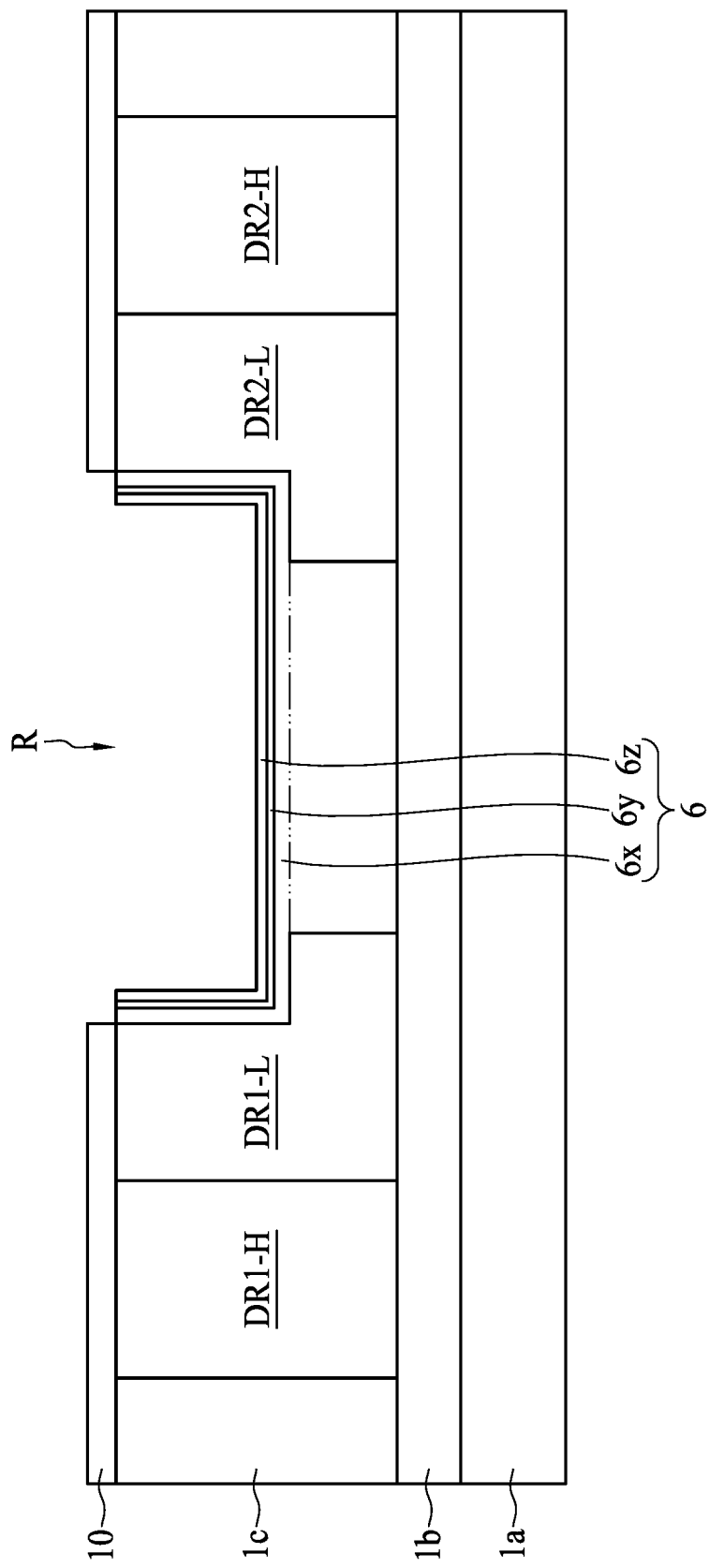
Figure 5U:
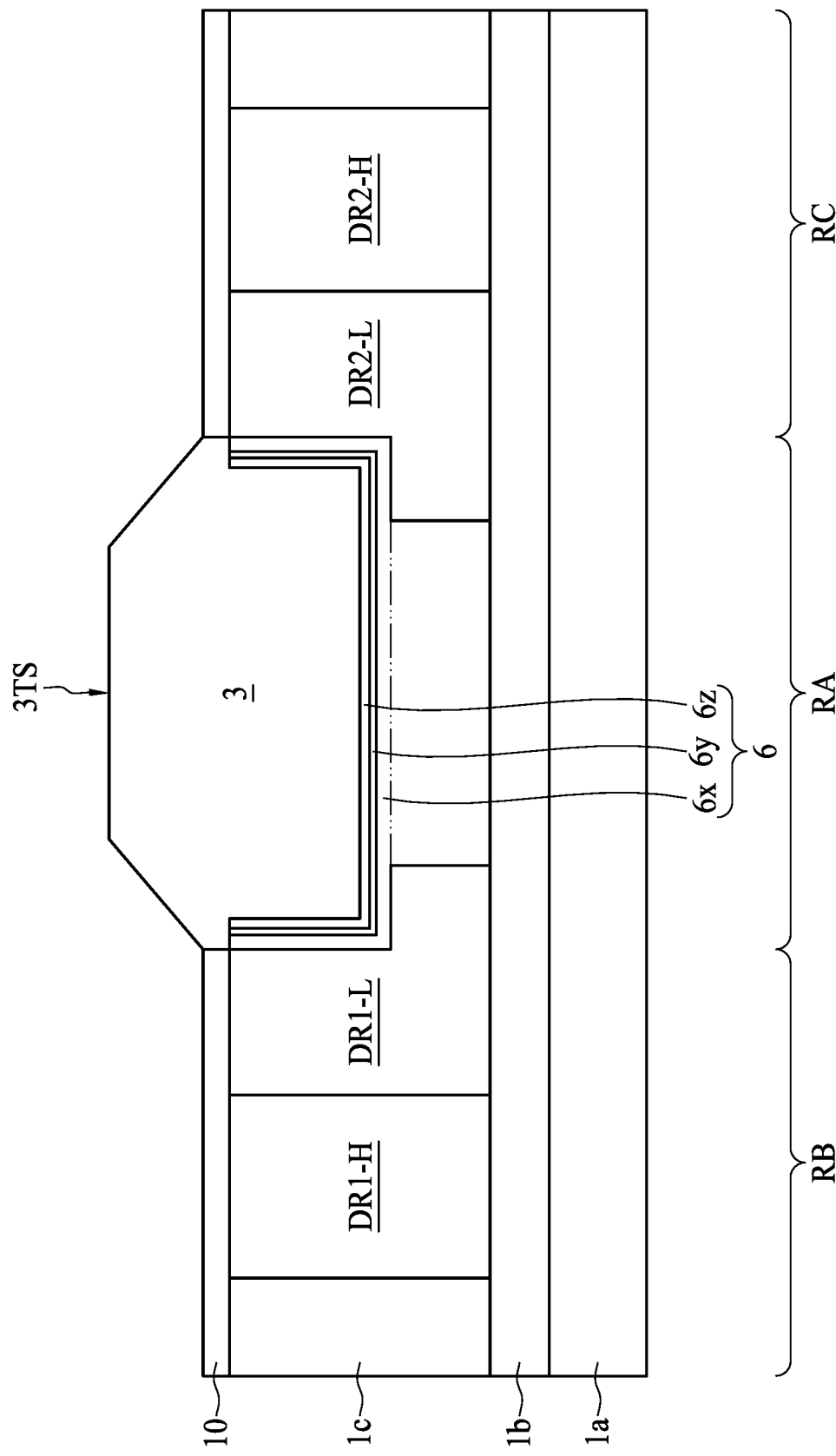

FIG. 5A to FIG. 5U illustrate an embodiment of operations for forming a photo sensing device after provision of the substrate 1 as shown in FIG. 4. FIG. 5A and FIG. 5B are cross sectional views of a photo sensing device during intermediate stages of manufacturing operations, according to some embodiments of the present disclosure. Referring to FIG. 5A, a first mask 301 is formed over the first side FS of the substrate 1 and then patterned. An implantation operation of implanting a first conductivity type dopant (for example, p-type) in the second region RB is thereby performed in order to form a lightly doped region DR1-L. In some of the embodiments, a portion of the lightly doped region DR1-L is also formed in the first region RA at a location proximal to the second region RB. In some of the embodiments, a depth of the lightly doped region DR1-L is substantially identical with a thickness t1c of the surface layer 1c. Referring to FIG. 5B, the first mask 301 is removed after the implantation.

FIG. 5C and FIG. 5D are cross sectional views of a photo sensing device during intermediate stages of manufacturing operations, according to some embodiments of the present disclosure. Referring to FIG. 5C, a second mask 302 is formed above the surface layer 1c and then patterned to expose a portion of a top surface of the lightly doped region DR1-L. An implantation operation of implanting the first conductivity type dopant (for example, p-type) is thereby performed in a portion of the lightly doped region DR1-L in order to form a heavily doped region DR1-H having a higher concentration of the first conductivity type dopant than the lightly doped region DR1-L. Herein the heavily doped region DR1-H and the lightly doped region DR1-L are collectively referred to as the first doped region DR1. Referring to FIG. 5D, the second mask 302 is removed after the implantation.

FIG. 5E and FIG. 5F are cross sectional views of a photo sensing device during intermediate stages of manufacturing operations, according to some embodiments of the present disclosure. Referring to FIG. 5E, a third mask 303 is formed over the first side FS of the substrate 1 and then patterned. An implantation operation of implanting a second conductivity type dopant (for example, n-type) in the third region RC is thereby performed in order to form a lightly doped region DR2-L. In some of the embodiments, a portion of the lightly doped region DR2-L is also formed in the first region RA at a location proximal to the third region RC. In some of the embodiments, a depth of the lightly doped region DR2-L is substantially identical with a thickness t1c of the surface layer 1c. Referring to FIG. 5F, the third mask 303 is removed after the implantation.

FIG. 5G and FIG. 5H are cross sectional views of a photo sensing device during intermediate stages of manufacturing operations, according to some embodiments of the present disclosure. Referring to FIG. 5G, a fourth mask 304 is formed above the surface layer 1c and patterned to expose a portion of a top surface of the lightly doped region DR2-L. An implantation operation of implanting the second conductivity type dopant (for example, n-type) is thereby performed in a portion of the lightly doped region DR2-L in order to form a heavily doped region DR2-H having a higher concentration of the second conductivity type dopant than the lightly doped region DR2-L. Herein the heavily doped region DR2-H and the lightly doped region DR2-L are collectively referred to as the second doped region DR2. Referring to FIG. 5H, the fourth mask 304 is removed after the implantation.

FIG. 5I to FIG. 5L are cross sectional views of a photo sensing device during intermediate stages of manufacturing operations, according to some embodiments of the present disclosure. Referring to FIG. 5I, an insulation layer 10 is formed over the first side of the substrate 1. In some embodiments, the insulation layer 10 is an oxide layer. Optionally, a chemical mechanical planarization (CMP) operation is performed on an exposed top surface of the insulation layer 10. Referring to FIG. 5J, a fifth mask 305, which may be a hard mask, is formed above the insulation layer 10. Optionally, a CMP operation can be performed on an exposed top surface of the fifth mask 305. Referring to FIG. 5K, the fifth mask 305 is patterned, and the insulation layer 10 is etched to expose a portion of the surface layer 1c, which may include a top surface of the surface layer 1c in the first region RA, a top surface of a portion of the lightly doped region DR1-L in the second region RB adjacent to the first region RA, and a top surface of a portion of the lightly doped region DR2-L in the third region RC adjacent to the first region RA. Referring to FIG. 5L, the fifth mask 305 is removed after patterning of the insulation layer 10.

FIG. 5M is a cross sectional view of a photo sensing device during intermediate stages of manufacturing operations, according to some embodiments of the present disclosure. An etch operation is performed through the insulation layer 10 to remove a portion of the surface layer 1c and form a recess R. It should be noted that a portion of the surface layer 1c in the first region RA is remained between a bottom surface of the recess R and the insulation layer 1b of the substrate 1. Herein an exposed surface RG of the recess R has a first roughness after performing the etching operation. It should be noted that, a roughness of a recess affects the growth of an epitaxial layer. When a bottom surface of a recess is too rough/too non-uniform, it may exacerbate dislocation defects (such as threading dislocation), undesired and abrupt changes in electrical and/or optical properties, or device failure. In order to alleviate the issue, a roughness of the exposed surface RG of the recess R may be reduced by the operations subsequently discussed in FIG. 5N to FIG. 5Q.

FIG. 5N is a cross sectional view of a photo sensing device during intermediate stages of manufacturing operations, according to some embodiments of the present disclosure. The substrate 1 is undergone an oxidation operation to form an oxide layer 99 at the exposed surface RG of the recess R (including bottom surface and inner sidewall). It is discovered that a reaction rate of oxidation is positively related to a local roughness of a surface. Therefore, a relatively rougher part of the exposed surface of the recess R can be transformed into oxide layer 99 with higher reaction rate.

FIG. 5O is a cross sectional view of a photo sensing device during intermediate stages of manufacturing operations, according to some embodiments of the present disclosure. The formed oxide layer 99 at the exposed surface of the recess R is removed to expose a surface of the surface layer 1c. In some embodiments, the oxide layer 99 is removed by chemical, such as hydrogen fluoride or other suitable chemicals. As previously discussed, since the reaction rate at rougher location may be higher than the reaction rate at less rough locations, more material of surface layer 1c (which may include silicon) at rougher surface would be consumed in same period of time. This effect may contribute to uniformity of a surface profile of the exposed surface of the recess R. As a result, an exposed surface RG' of the recess R after the first oxidation operation has a second roughness less than the first roughness of the exposed surface RG of the recess R prior to the first oxidation operation.

FIG. 5P and FIG. 5Q are cross sectional views of a photo sensing device during intermediate stages of manufacturing operations, according to some embodiments of the present disclosure. In some embodiments, the roughness of the exposed surface RG' of the recess R can further be reduced by performing one or more cycles of oxidation to form a oxide layer 99 at the exposed surface (as discussed in FIG. 5N) and removal of the oxide layer 99 (as discussed in FIG. 5O). After cycle(s) of such operations, an exposed surface RG" of the recess R after the annealing operation may have a roughness even less than the roughness of the exposed surface RG' of the recess R. For example, an exposed surface RG" of the recess R after cycles of oxidation operation has a third roughness less than the first roughness of the exposed surface RG of the recess R and the second roughness of the exposed surface RG'. By the operations introduced in FIG. 5N to FIG. 5Q, the factor of roughness of starting surface of epitaxial growth, which is one of the factor that may catalyze or exacerbate dislocation defects, may be alleviated.

FIG. 5R to FIG. 5T are cross sectional views of a photo sensing device during intermediate stages of manufacturing operations, according to some embodiments of the present disclosure. A semiconductor stack 6 is formed in the recess R. Referring to FIG. 5R, a first semiconductor layer 6x is formed on the exposed surface of the recess R. In some embodiments, the first semiconductor layer 6x conforms to a profile of the recess R. In some embodiments, the first semiconductor layer 6x is formed by Selective Epitaxial Growth (SEG) technique. In some embodiments, the first semiconductor layer 6x includes a material identical to the surface layer 1c, such as intrinsic silicon or silicon.

Referring to FIG. 5S, a second semiconductor layer 6y is formed over a top surface and an inner sidewall of the first semiconductor layer 6x, wherein the second semiconductor layer 6y is surrounded by the first semiconductor layer 6x. In some embodiments, the second semiconductor layer 6y is formed by Selective Epitaxial Growth (SEG) technique. In some embodiments, the second semiconductor layer 6y includes a material different from the first semiconductor layer 6x, such as intrinsic germanium or germanium.

Referring to FIG. 5T, a third semiconductor layer 6z is formed over a top surface and an inner sidewall of the second semiconductor layer 6y, wherein the third semiconductor layer 6z is surrounded by the second semiconductor layer 6y. In some embodiments, the third semiconductor layer 6z is formed by Selective Epitaxial Growth (SEG) technique. In some embodiments, the third semiconductor layer 6z includes a material identical with the first semiconductor layer 6x, such as intrinsic silicon or silicon.

As previously discussed in FIG. 2B, in some embodiments, one or more semiconductor layers having material identical to the first semiconductor layer 6x and one or more semiconductor layers having material identical to the second semiconductor layer 6y may further be formed and alternately stacked in order to provide a surface of a semiconductor layer having a lattice constant closer to a material of a photosensitive member 3 to be formed (which would be subsequently discussed in FIG. 5U). The aforesaid semiconductor layers formed in the recess R can be collectively referred to as a semiconductor stack 6.

FIG. 5U is a cross sectional view of a photo sensing device during intermediate stages of manufacturing operations, according to some embodiments of the present disclosure. A photosensitive member 3 is formed in the recess R (shown in FIG. 5T), as the photosensitive member 3 is surrounded by the semiconductor stack 6. In some embodiments, the photosensitive member 3 is formed by Selective Epitaxial Growth (SEG) technique. In some embodiments, the photosensitive member 3 includes an epitaxial material, for example, intrinsic germanium or germanium. In some embodiments, an upper portion of the photosensitive member 3 protrudes from the recess R and the insulation layer 10, and may have an inclined surface, wherein the upper portion of the photosensitive member 3 has a facet inclining toward the top. As discussed in FIG. 1 to FIG. 2B, by the configuration of the semiconductor stack 6, the lattice mismatch between the photosensitive member 3 and the substrate 1 may be alleviated.

Similar to the operations discussed in FIG. 5A to FIG. 5U, FIG. 6A to FIG. 6F illustrate another embodiment of operations for forming a photo sensing device. However, when required temperature of oxidizing (oxygen thermal annealing) the substrate is higher (such as higher than 800° C.), it may cause relatively undesired diffusion effect of doped regions. Therefore, the doped regions can optionally be formed after annealing operations instead.

Figure 6A:
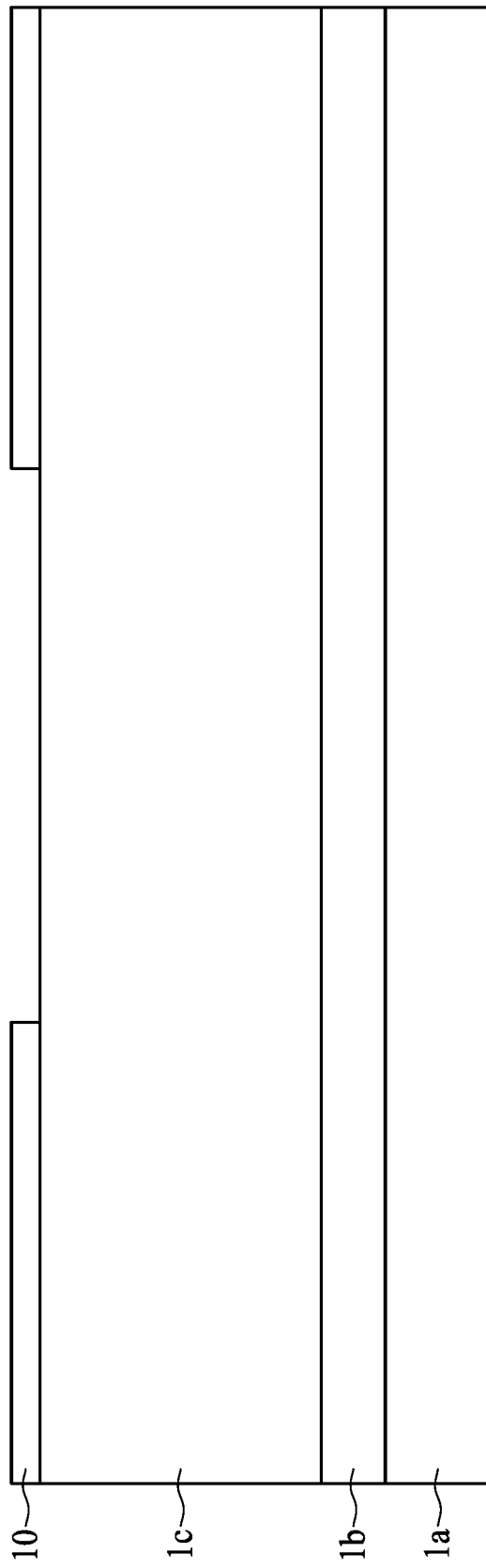
FIG. 6A to FIG. 6F are cross sectional views of a photo sensing device during intermediate stages of manufacturing operations, according to some embodiments of the present disclosure.

FIG. 6A to FIG. 6F illustrate another embodiment of operations for forming a photo sensing device. FIG. 6A is a cross sectional view of a photo sensing device during intermediate stages of manufacturing operations, according to some embodiments of the present disclosure. Similar to the operation discussed in FIG. 5I to FIG. 5L, an insulation layer 10 is formed above the substrate 1 and then patterned. A top surface of the surface layer 1c over the first region RA is exposed.

Figure 6B:
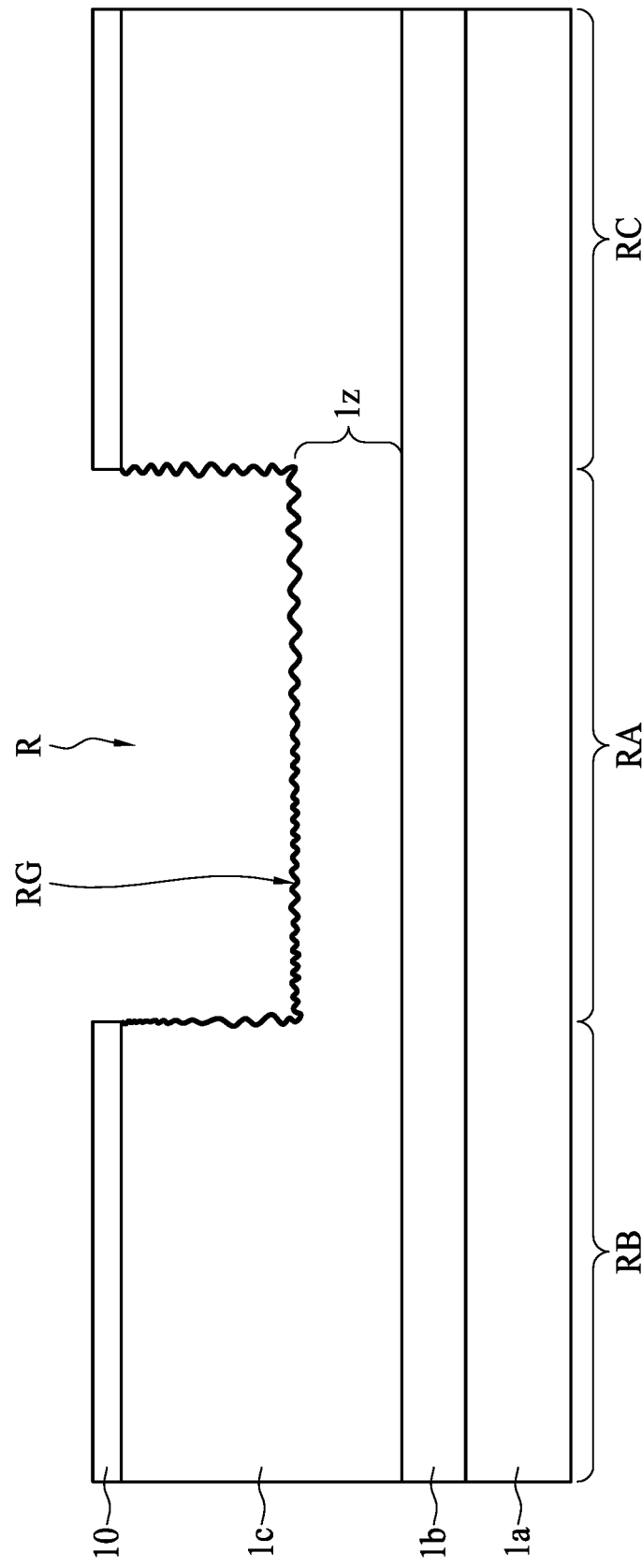

FIG. 6B is a cross sectional view of a photo sensing device during intermediate stages of manufacturing operations, according to some embodiments of the present disclosure. Similar to the operation discussed in FIG. 5M, an etch operation is performed to form a recess R in the first region RA. Herein an exposed surface RG of the recess R has a first roughness after etching operation.

Figure 6C:
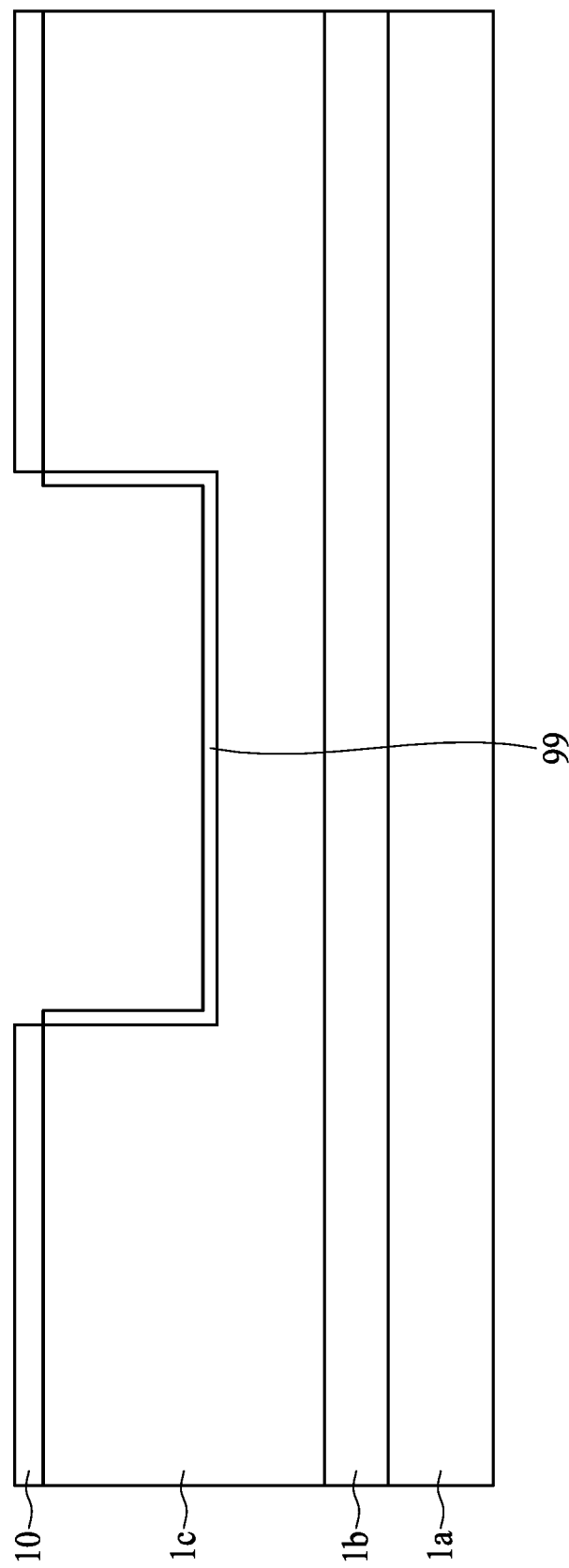
Figure 6D:
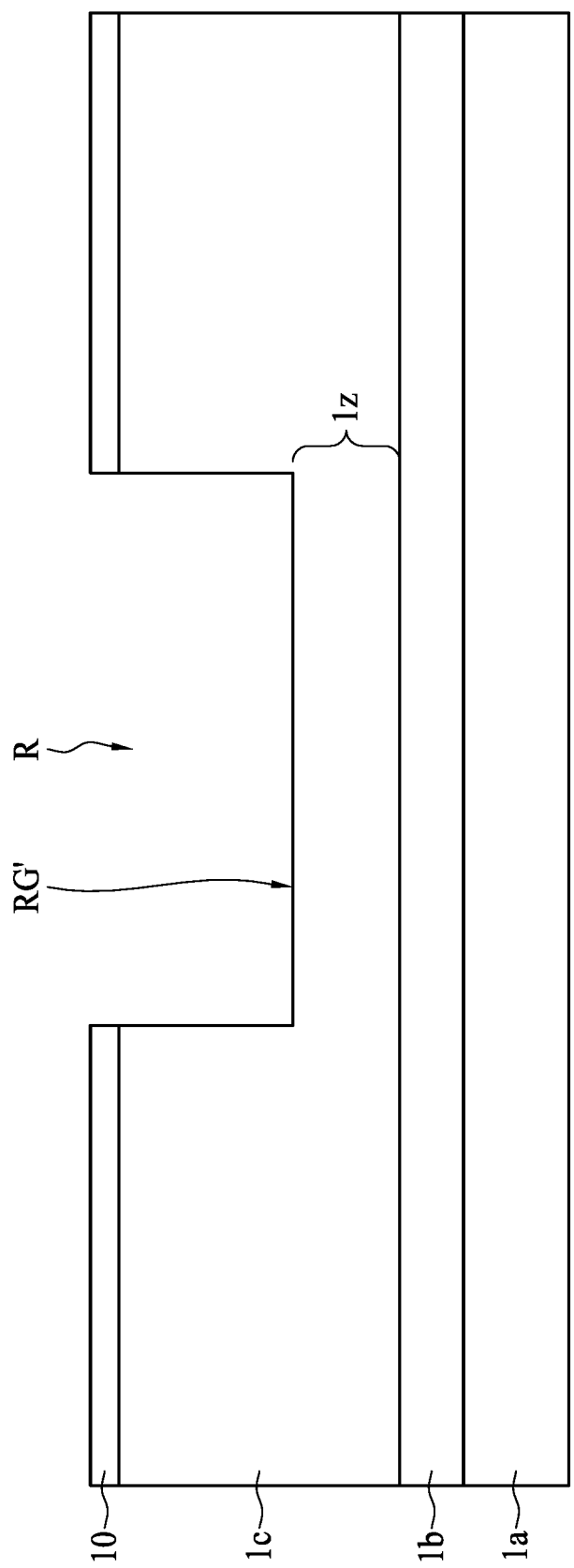

FIG. 6C and FIG. 6D are cross sectional views of a photo sensing device during intermediate stages of manufacturing operations, according to some embodiments of the present disclosure. Similar to the operations discussed in FIG. 5N to FIG. 5Q, one or more cycles of (1) oxidizing the substrate 1 for forming an oxide layer 99 at the exposed surface RG of the recess R, and (2) removing the oxide layer 99 to expose a surface of the surface layer 1c, are performed in order to alleviate the roughness of the exposed surface RG of the recess R. After the cycle(s) are performed, an exposed surface RG' has a second roughness less than the first roughness prior to performing the aforesaid one or more cycles. In some embodiments, in order to effectively oxidize the exposed surface RG of the recess R, the substrate 1 underwent an oxidation (oxygen thermal annealing) operation under a temperature over 800° C.

Figure 6E:
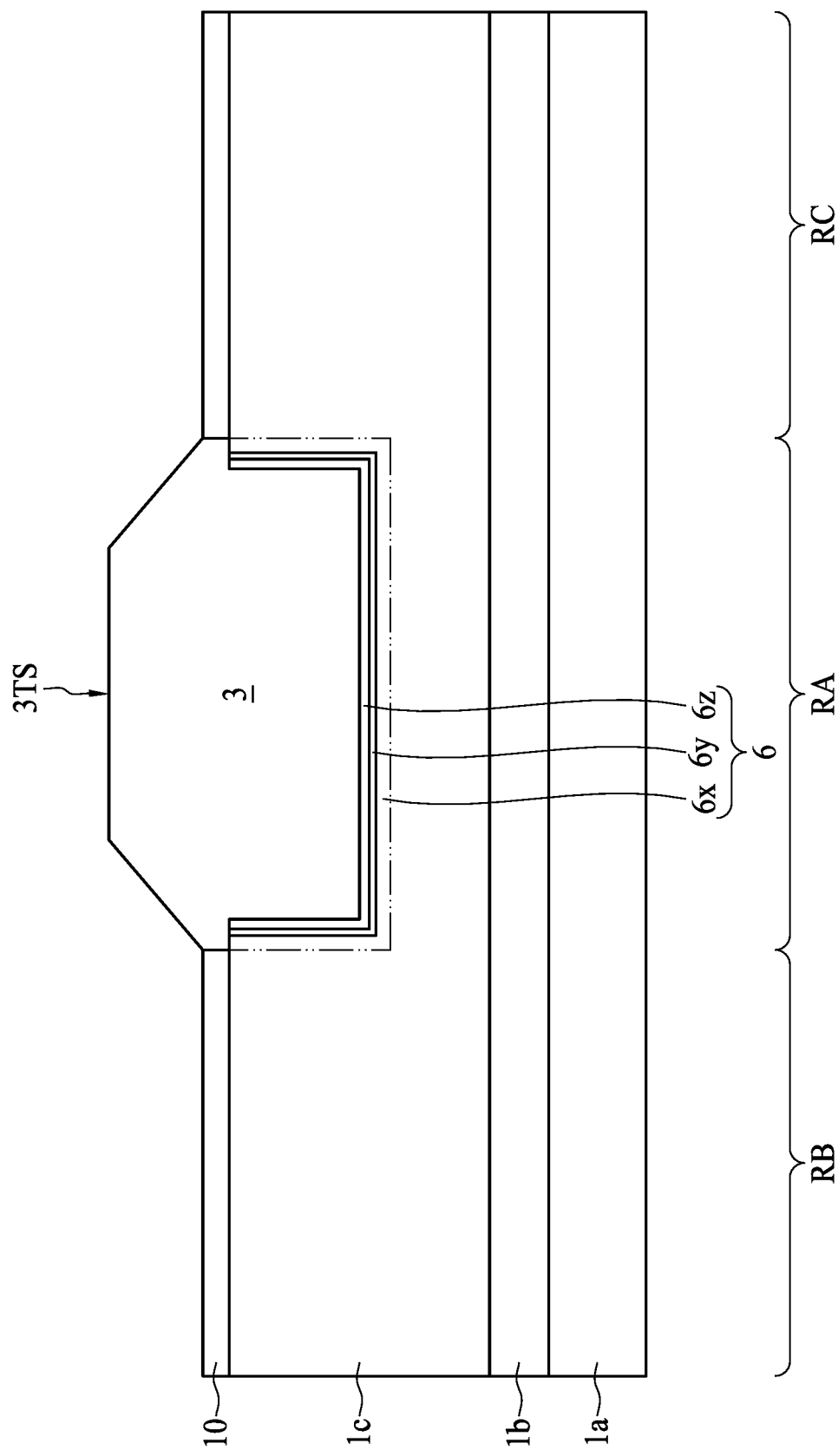

FIG. 6E is a cross sectional view of a photo sensing device during intermediate stages of manufacturing operations, according to some embodiments of the present disclosure. Similar to the operations discussed in FIG. 5R to FIG. 5U, a semiconductor stack 6 and a photosensitive member 3 is formed in the recess R, wherein the semiconductor stack 6 conforms to the exposed surface of the recess R and the photosensitive member 3 is surrounded by the semiconductor stack 6. The configuration of the semiconductor stack 6 was discussed in FIG. 2A to FIG. 2B, wherein the total number of semiconductor layers may be varied based on needs or design rules (under the considerations of size, critical dimension, or other factors). Each semiconductor layer of the semiconductor stack 6 and the photosensitive member 3 may be formed by Selective Epitaxial Growth (SEG) technique.

Figure 6F:
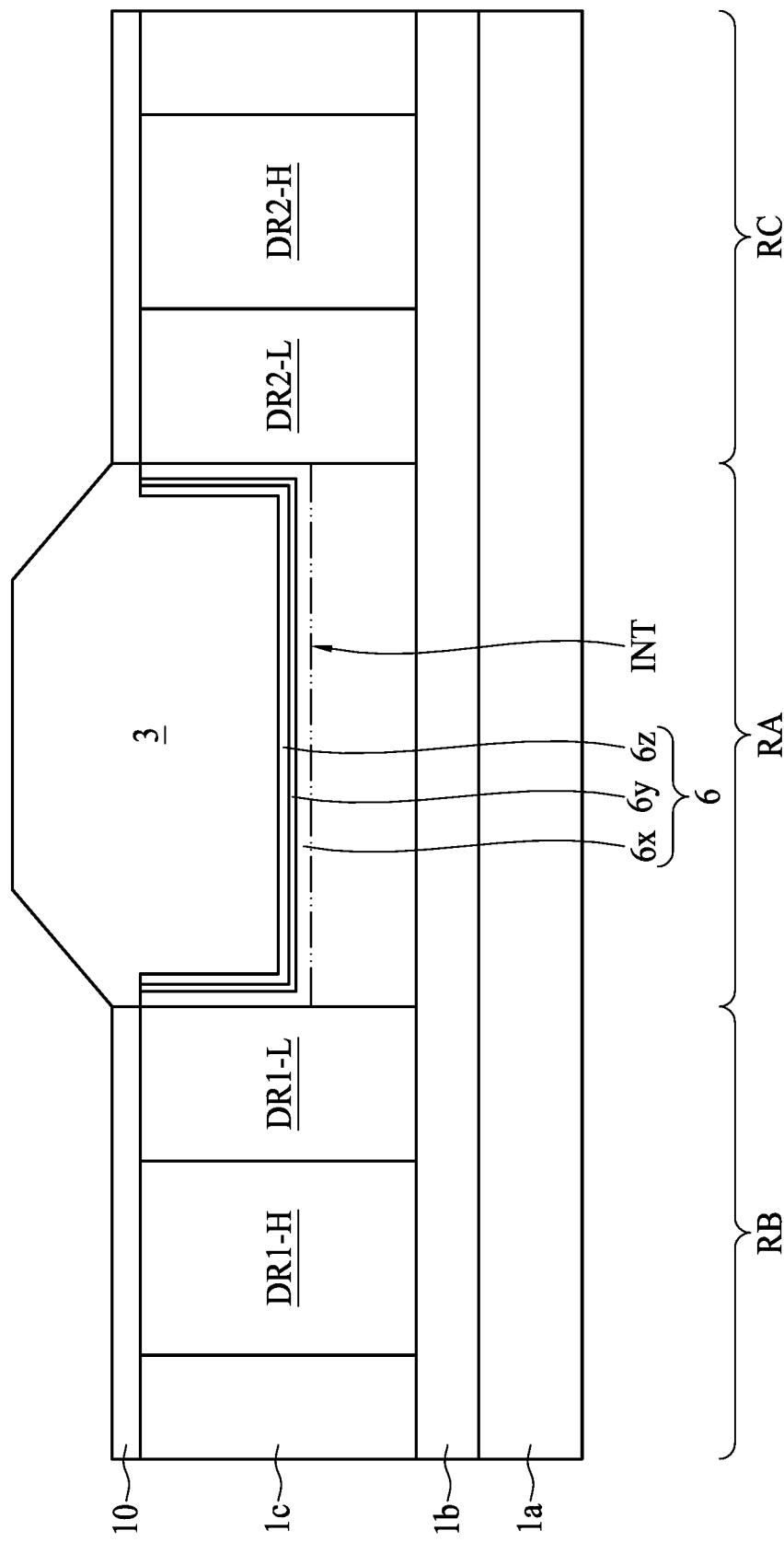

FIG. 6F is a cross sectional view of a photo sensing device during intermediate stages of manufacturing operations, according to some embodiments of the present disclosure. As previously discussed, since the substrate 1 is heated under a higher temperature (e.g. oxygen thermal annealing operation under a temperature over 800° C.), the implant operation for forming doped regions, similar to the operations discussed in FIG. 5A to FIG. 5H, can optionally be performed after annealing operations to alleviate diffusion issues. Herein the first doped region DR1 having the first conductivity type (such as p-type) is formed in the second region RB and the second doped region DR2 having the second conductivity type (such as n-type) is formed in the third region RC. The first doped region DR1 includes a lightly doped region DR1-L adjacent to the photosensitive member 3 and a heavily doped region DR1-H adjacent to the lightly doped region DR1-L. The second doped region DR2 includes a lightly doped region DR2-L adjacent to the photosensitive member 3 and a heavily doped region DR2-H adjacent to the lightly doped region DR2-L. In some of the embodiments, a depth of the first doped region DR1 or the second doped region DR2 is substantially identical with a thickness t1c of the surface layer 1c (as shown in FIG. 4).

The operations subsequently discussed in FIG. 7 to FIG. 17 can be implemented after the operation(s) discussed in FIG. 5U, or alternatively, after the operation(s) discussed in FIG. 6F.

Figure 7:
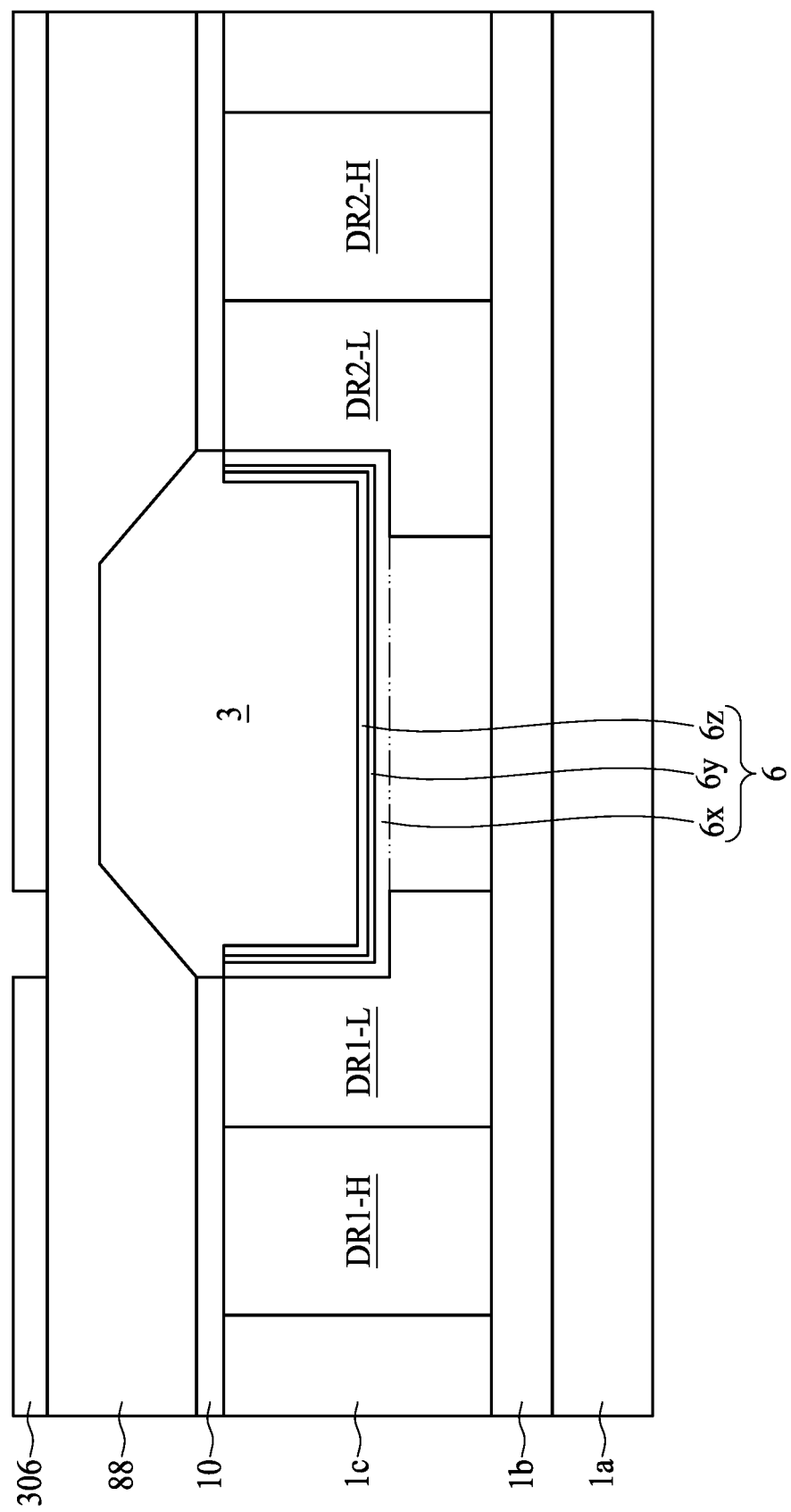
FIG. 7 to FIG. 17 are cross sectional views of a photo sensing device during intermediate stages of manufacturing operations, according to some embodiments of the present disclosure.

FIG. 7 is a cross sectional view of a photo sensing device during intermediate stages of manufacturing operations, according to some embodiments of the present disclosure. A first sacrificial masking layer 88 is formed over the insulation layer 10, wherein the first sacrificial masking layer 88 covers the photosensitive member 3. Optionally, a pad oxide layer (not shown in FIG. 7) is formed over the insulation layer 10 and the photosensitive member 3 prior to forming the first sacrificial masking layer 88. In some embodiments, the first sacrificial masking layer 88 may include oxide, silicon nitride (SiN), or the like. A sixth mask 306 is formed and patterned over the first sacrificial masking layer 88. Specifically, a portion of the sixth mask 306 over the first region RA and at a position adjacent to the second region RB is removed to expose an underlying portion of the first sacrificial masking layer 88. However, in the case shown in FIG. 5M to FIG. 5U, a portion of the first doped region DR1 may be in the first region RA and directly below the photosensitive member 3, wherein a portion of the sixth mask 306 directly above such portion may be removed.

Figure 8:
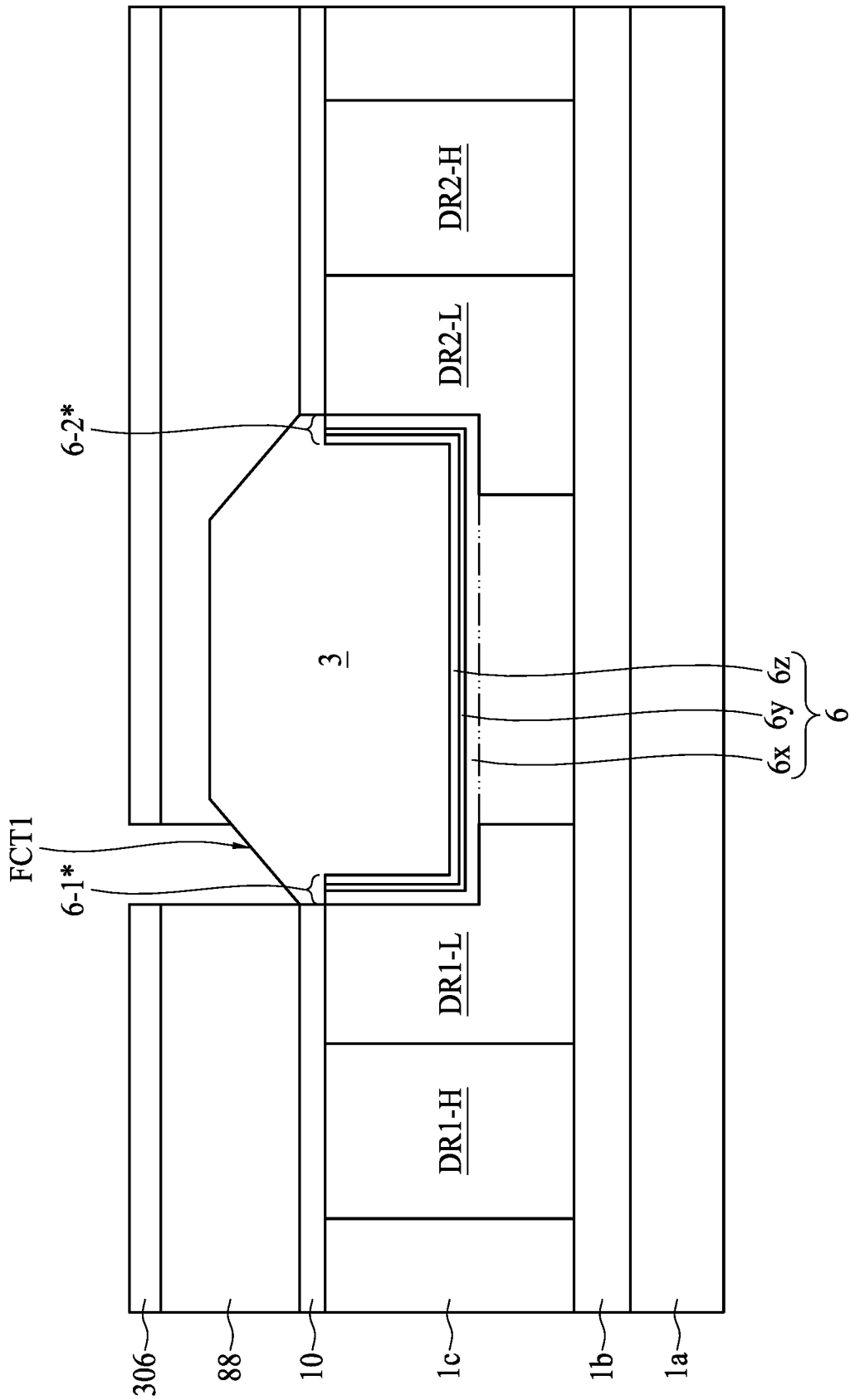

FIG. 8 is a cross sectional view of a photo sensing device during intermediate stages of manufacturing operations, according to some embodiments of the present disclosure. An etching operation can be performed through the sixth mask 306 to remove a portion of the first sacrificial masking layer 88 to expose a portion of a top surface of the photosensitive member 3. In some embodiments, a portion of a first facet FCT1 of the photosensitive member 3 adjacent/ proximal to the second region RB is exposed. In some of the embodiments, a portion 6-1* of the semiconductor stack 6 extending along the inner sidewall of the surface layer 1c (or alternatively stated, the portion adjacent to the second region RB) is directly under the exposed surface of the photosensitive member 3.

Figure 9:
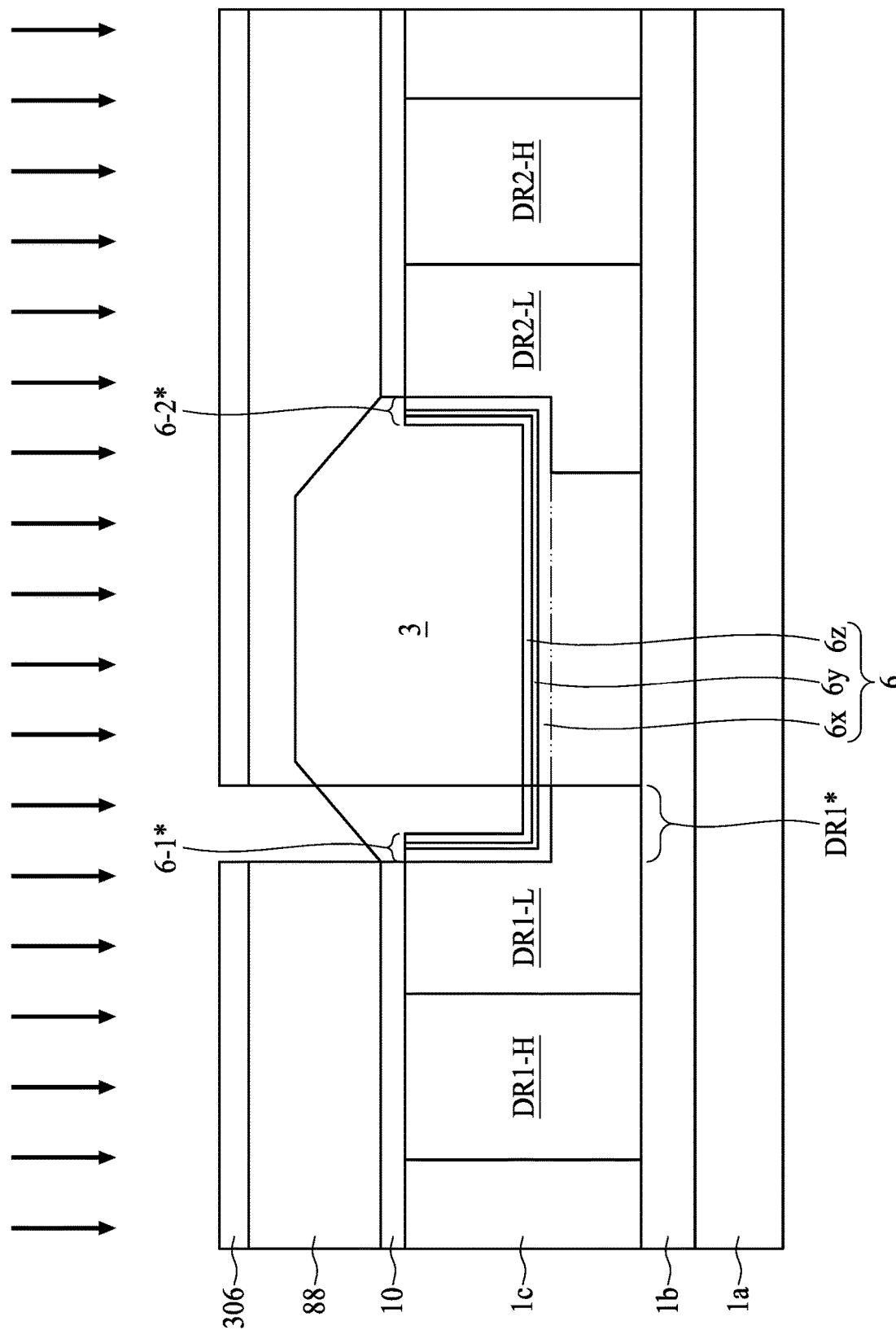

FIG. 9 is a cross sectional view of a photo sensing device during intermediate stages of manufacturing operations, according to some embodiments of the present disclosure. An implant operation of doping first conductivity type dopant is performed through the sixth mask 306. The portion 6-1* of the semiconductor stack 6 extending along the inner sidewall of the surface layer 1c and adjacent to the second region RB, a portion of the semiconductor stack 6 adjacent to the second region RB, and a portion of the photosensitive member 3 proximal to the second region RB is doped with the first conductivity type dopant (such as p-type dopant), wherein these doped portions are collectively referred to as the third doped region DR1*. A portion of the first portion 1z of the surface layer 1c adjacent to the second region RB may also be doped with the first conductivity type dopant. In some embodiments, a concentration of the first conductivity type dopant in the third doped region DR1* is lower than concentration of the first conductivity type dopant in the heavily doped region DR1-H.

Figure 10:
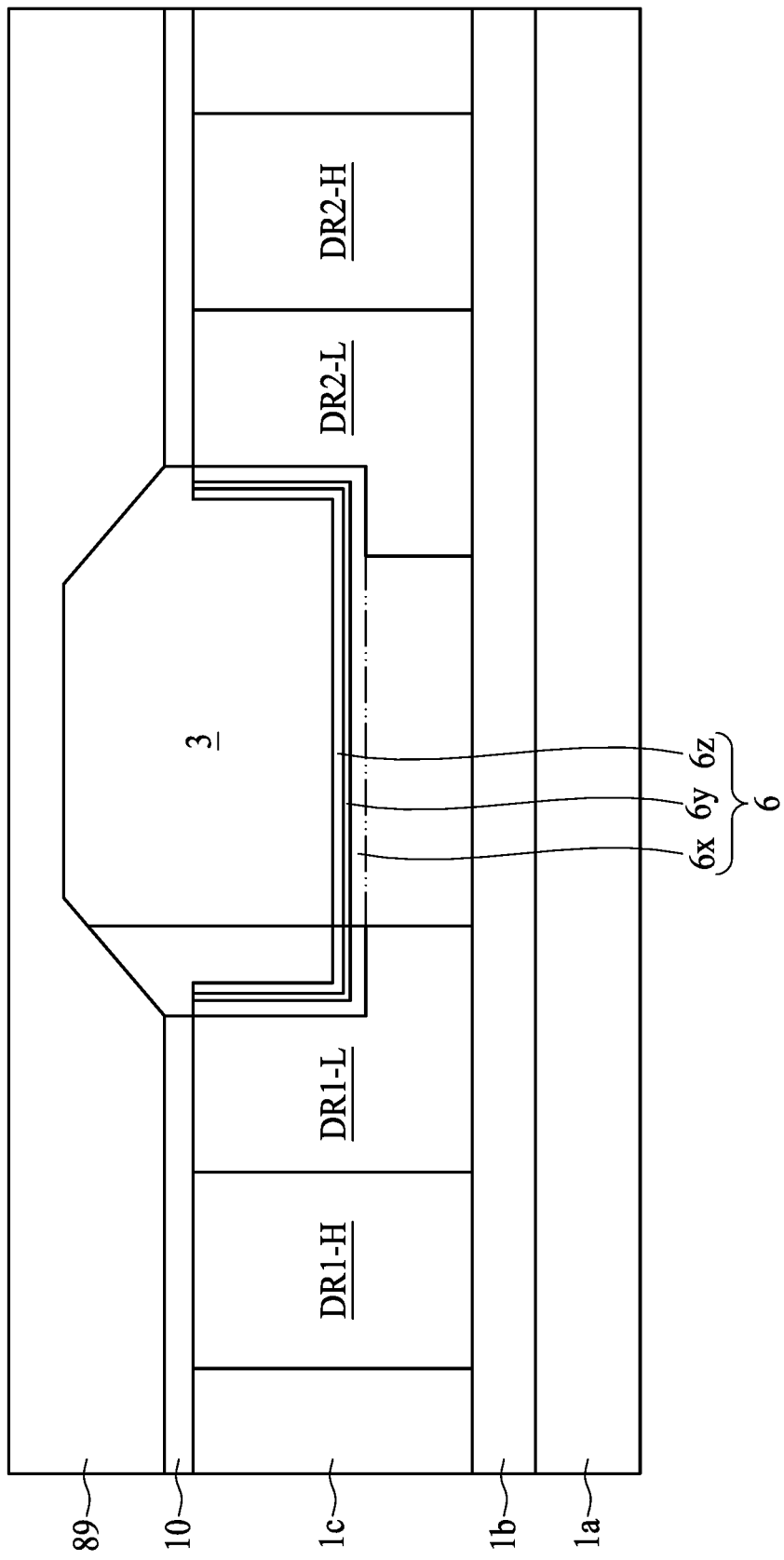
Figure 11:
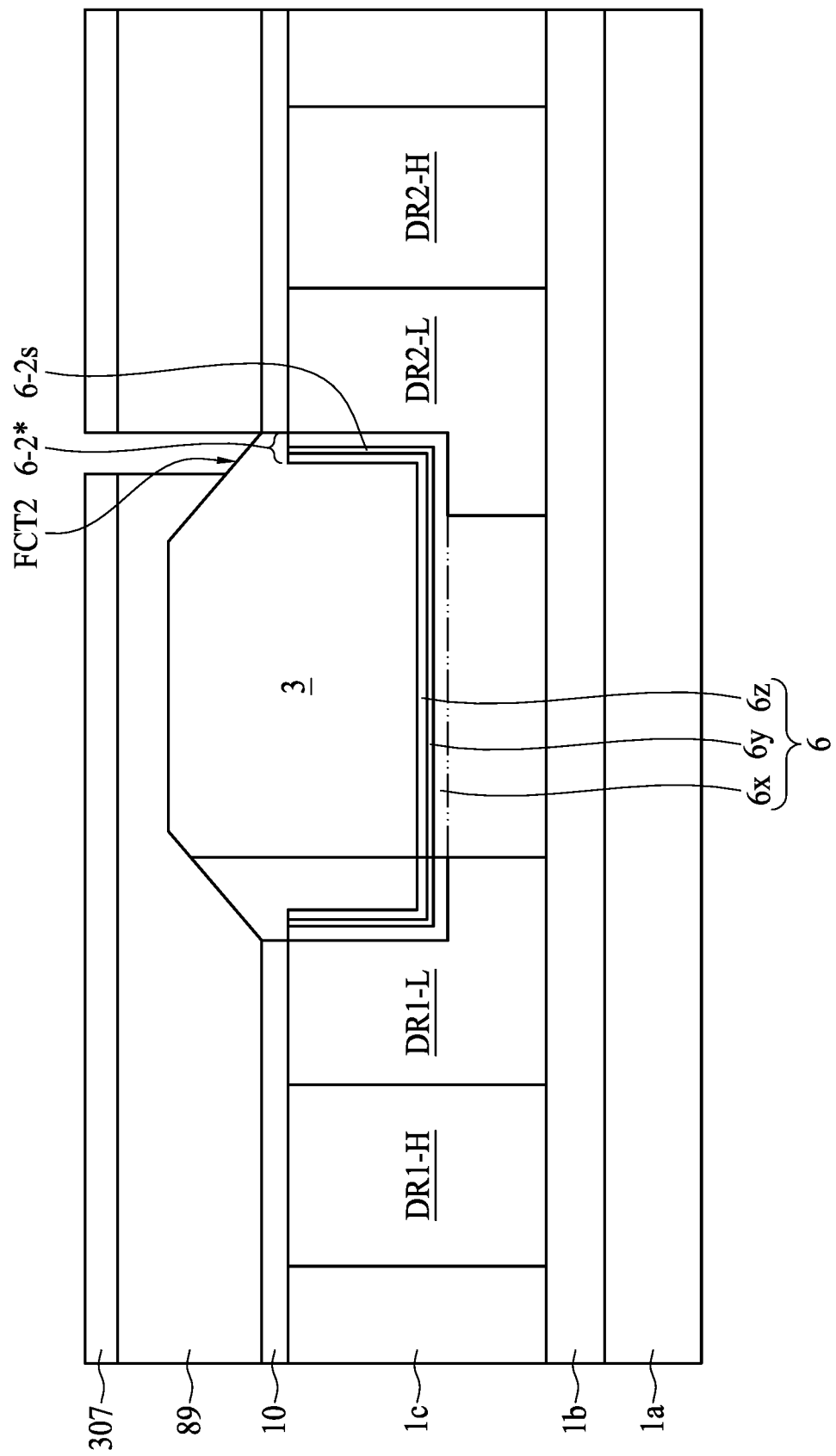
Figure 12:
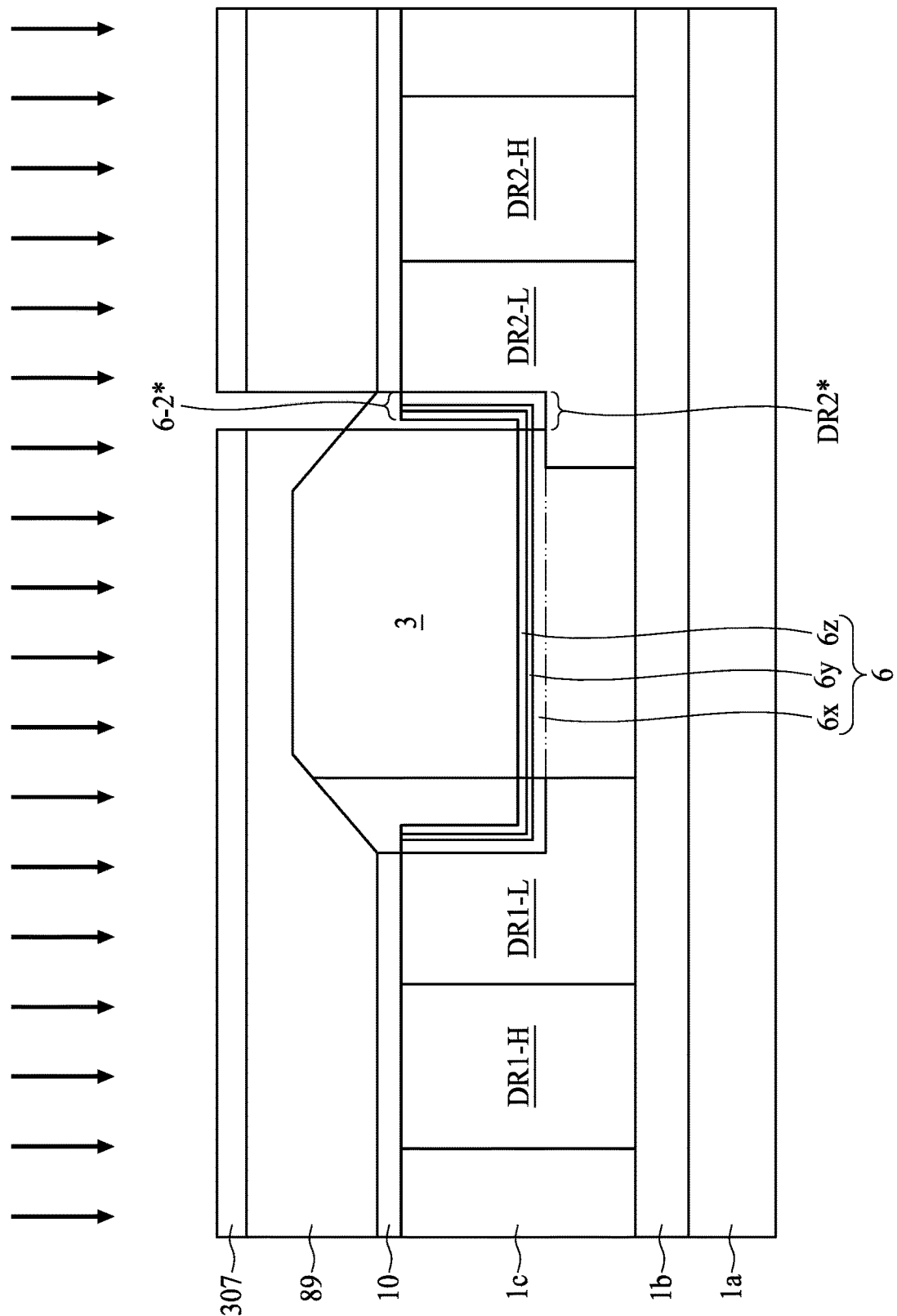

The operations discussed in FIG. 10 to FIG. 12 can optionally be performed. Referring to FIG. 10, FIG. 10 is a cross sectional view of a photo sensing device during intermediate stages of manufacturing operations, according to some embodiments of the present disclosure. The sixth mask 306 and the first sacrificial masking layer 88 are subsequently removed. A second sacrificial masking layer 89 is then formed above the insulation layer 10, wherein the second sacrificial masking layer 89 covers the photosensitive member 3. In some embodiments, the second sacrificial masking layer 89 may include oxide, silicon nitride (SiN), or the like. Optionally, a pad oxide layer (not shown in FIG. 10) is formed over the insulation layer 10 and the photosensitive member 3 prior to forming the second sacrificial masking layer 89.

FIG. 11 is a cross sectional view of a photo sensing device during intermediate stages of manufacturing operations, according to some embodiments of the present disclosure. A seventh mask 307 is formed and patterned over the second sacrificial masking layer 89. Specifically, a portion of the seventh mask 307 over the first region RA and at a position adjacent to the third region RC is removed to expose an underlying portion of the second sacrificial masking layer 89. However, in the case shown in FIG. 5M to FIG. 5U, a portion of the second doped region DR2 may be in the first region RA and directly below the photosensitive member 3, wherein a portion of the seventh mask 307 directly above such portion may be removed. An etching operation can be performed through the seventh mask 307 to remove a portion of the second sacrificial masking layer 89 to expose a portion of a top surface of the photosensitive member 3. In some embodiments, a portion of a second facet FCT2 of the photosensitive member 3 adjacent/proximal to the third region RC is exposed. In some of the embodiments, a portion 6-2* of the semiconductor stack 6 extending along the inner sidewall of the surface layer 1c (or alternatively stated, the portion adjacent to the third region RC) is directly under the exposed surface of the photosensitive member 3.

FIG. 12 is a cross sectional view of a photo sensing device during intermediate stages of manufacturing operations, according to some embodiments of the present disclosure. An implant operation of doping second conductivity type dopant is performed through the seventh mask 307. The portion 6-2* of the semiconductor stack 6 extending along the inner sidewall of the surface layer 1c and adjacent to the third region RC, a portion of the semiconductor stack 6 adjacent to the third region RC, and a portion of the photosensitive member 3 proximal to the third region RC are doped with the second conductivity type dopant (such as n-type dopant), wherein these doped portions are collectively referred to as the fourth doped region DR2*. A portion of the first portion 1z of the surface layer 1c adjacent to the third region RC may also be doped with the second conductivity type dopant. In some embodiments, a concentration of the second conductivity type dopant in the fourth doped region DR2* is lower than the concentration of the second conductivity type dopant in the heavily doped region DR2-H.

By performing the doping operations discussed in FIG. 7 to FIG. 12 for forming the third doped region DR1* and the fourth doped region DR2* at least in a portion of the photosensitive member 3 and a portion of the semiconductor stack 6, carrier trapping issue due to band-offset between semiconductor layer 1c and the photosensitive member 3 can be alleviated and the carrier injection efficiency can be improved. As a result, the speed of detection and signal-converting of the photo sensing device 100 can further be improved.

Figure 13:
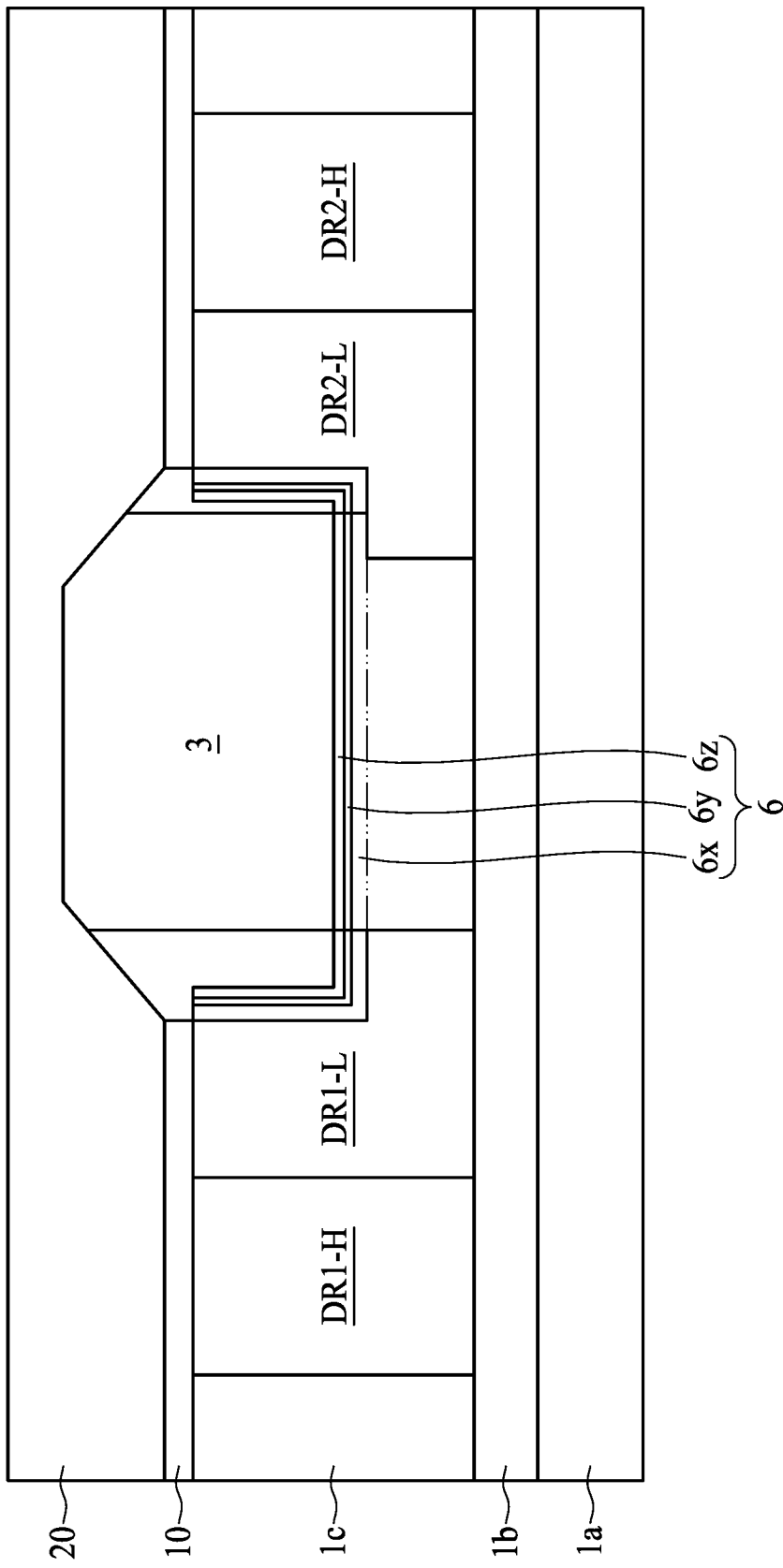

FIG. 13 is a cross sectional view of a photo sensing device during intermediate stages of manufacturing operations, according to some embodiments of the present disclosure. The seventh mask 307 and the second sacrificial masking layer 89 are subsequently removed. A capping layer 20 is then formed above the insulation layer 10, wherein the capping layer 20 covers the photosensitive member 3. In some embodiments, the capping layer 20 may include oxide, silicon nitride (SiN), or the like. Optionally, a pad oxide layer (not shown in FIG. 13) is formed over the insulation layer 10 and the photosensitive member 3 prior to forming the capping layer 20. A chemical mechanical planarization (CMP) operation can be performed on a top surface of the capping layer 20.

Figure 14:
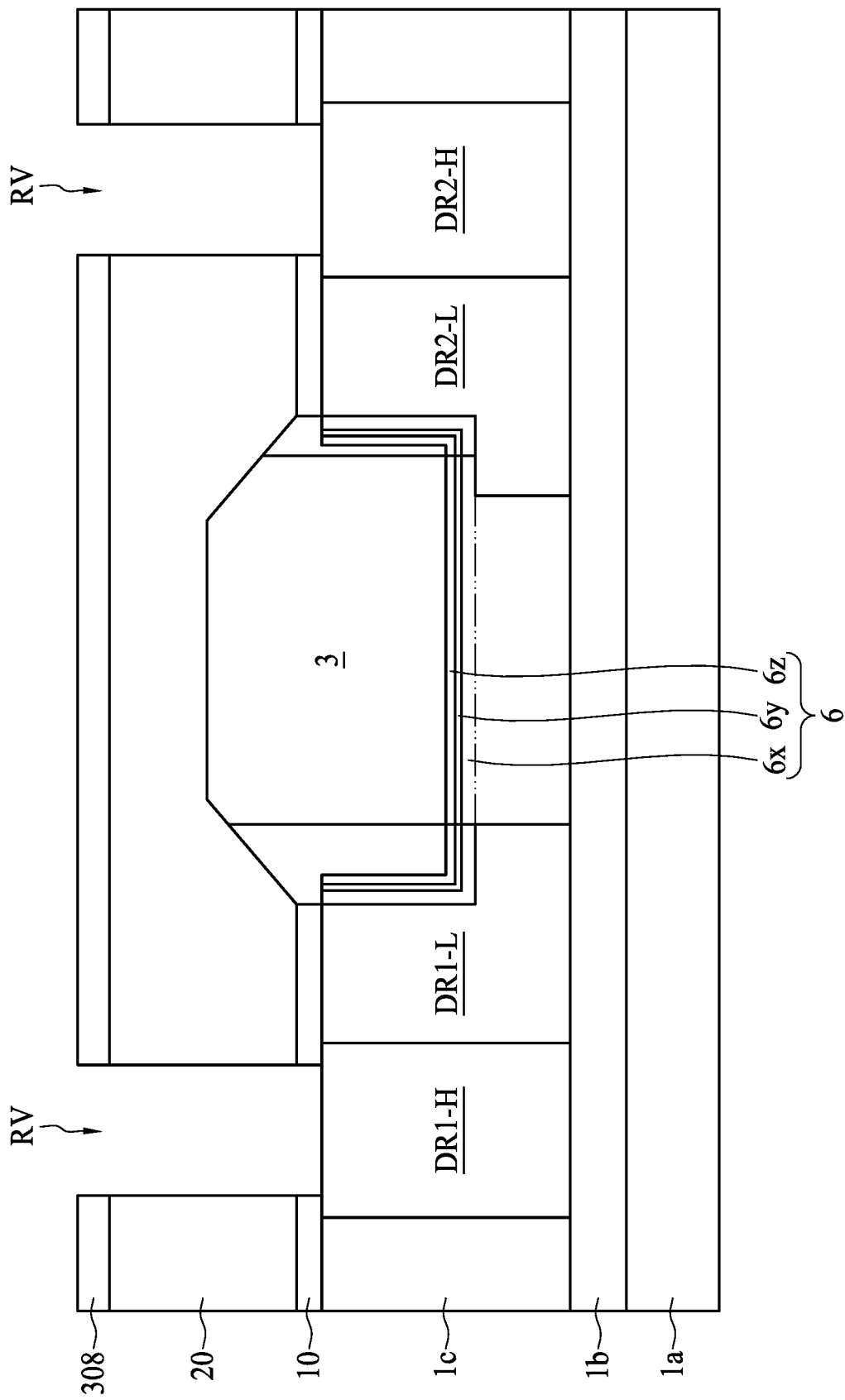

Referring to FIG. 14, FIG. 14 is a cross sectional view of a photo sensing device during intermediate stages of manufacturing operations, according to some embodiments of the present disclosure. An eighth mask 308 is formed and patterned above the capping layer 20. The portions of the capping layer 20 and the insulation layer 10 directly above the heavily doped region DR1-H of the first doped region DR1 and the heavily doped region DR2-H of the second doped region DR2 are removed by using the eighth mask 308. A plurality of recesses RV is formed and a portion of the top surface of the substrate 1 is thereby exposed.

Figure 15:
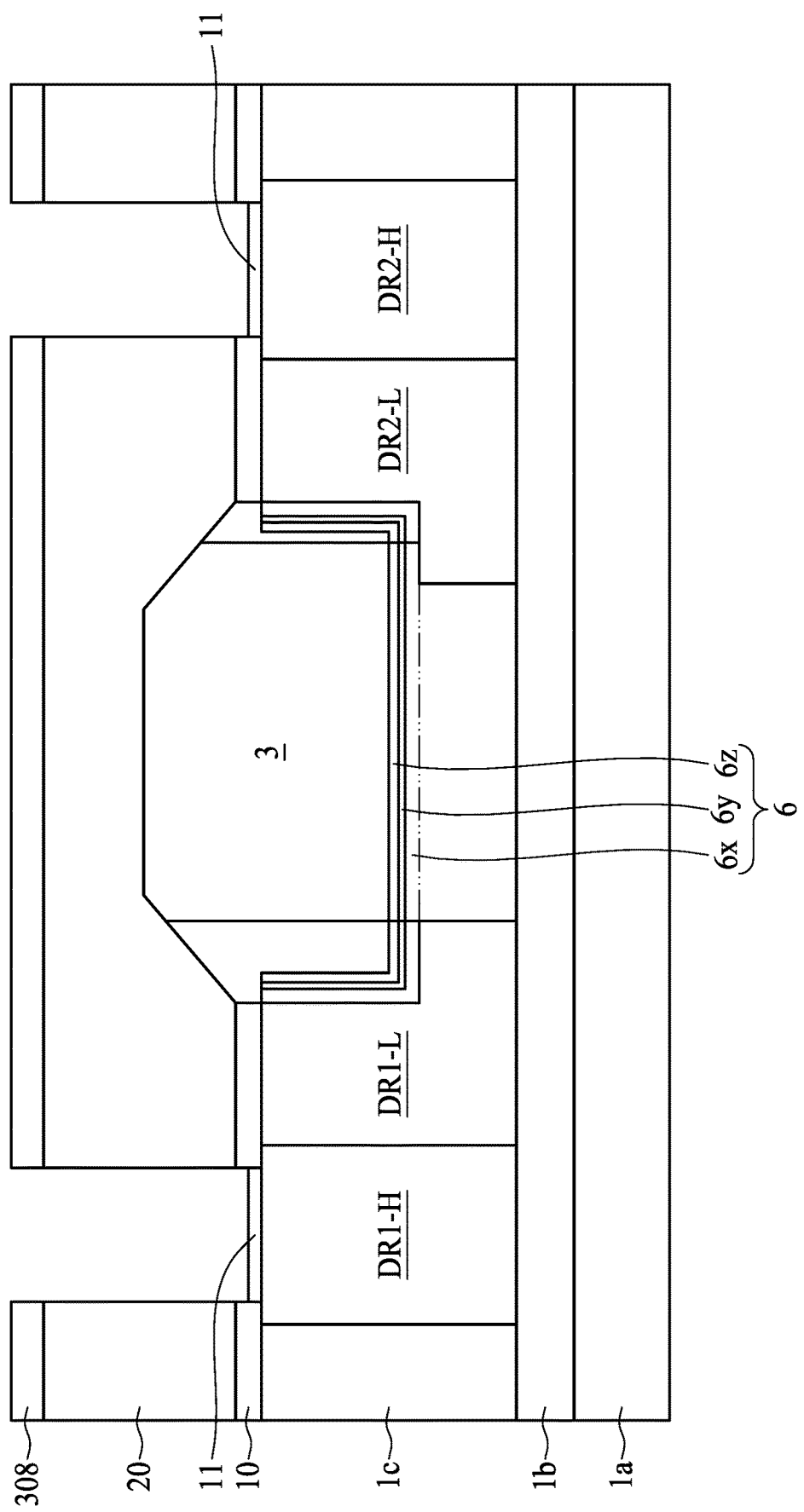

Referring to FIG. 15, FIG. 15 is a cross sectional view of a photo sensing device during intermediate stages of manufacturing operations, according to some embodiments of the present disclosure. Silicide layers 11, or other material suitable to be used as cathode/anode interface layer, are disposed in the recesses RV and above the heavily doped region DR1-H of the first doped region DR1 and the heavily doped region DR2-H of the second doped region DR2.

Figure 16:
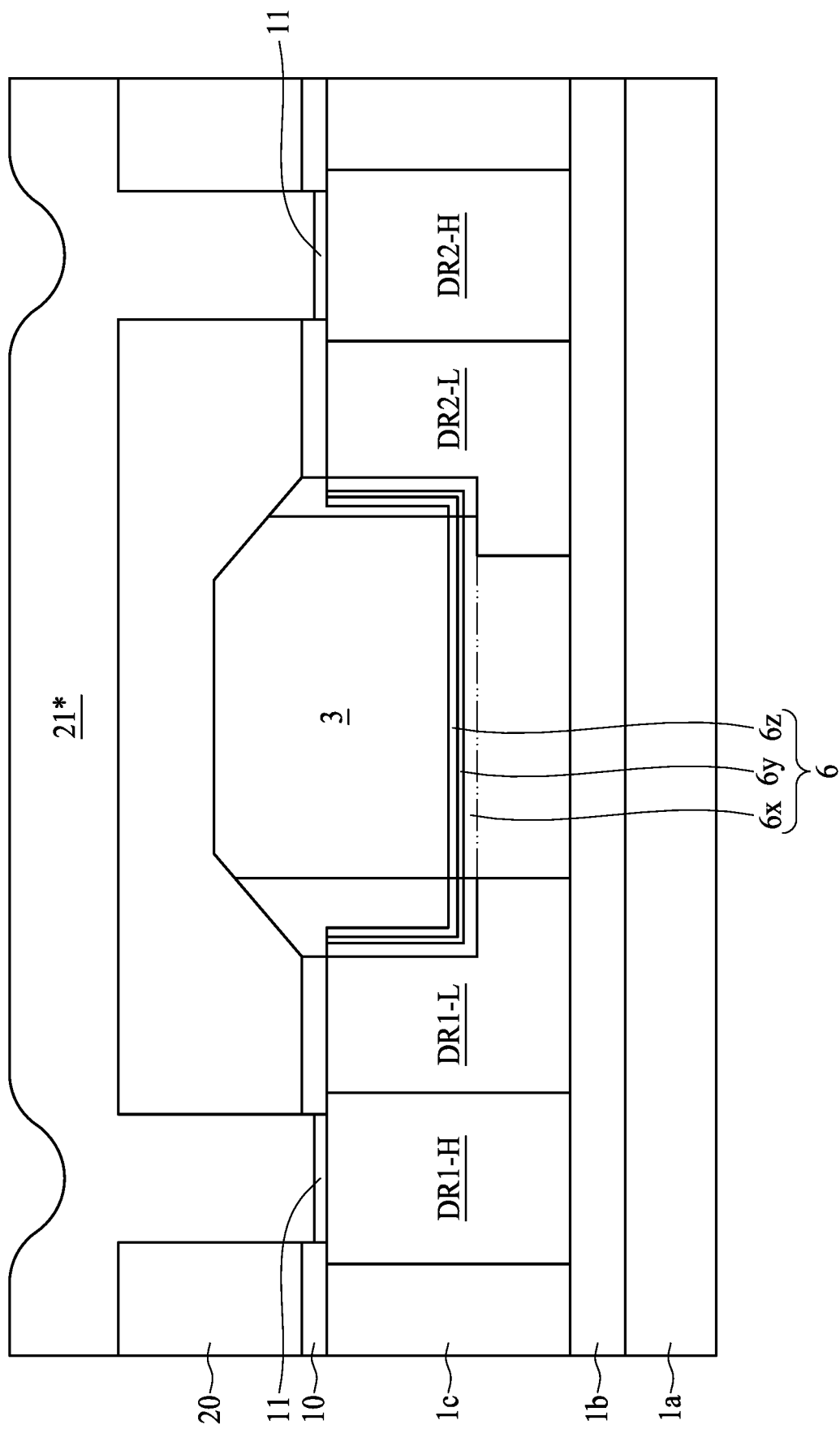
Figure 17:
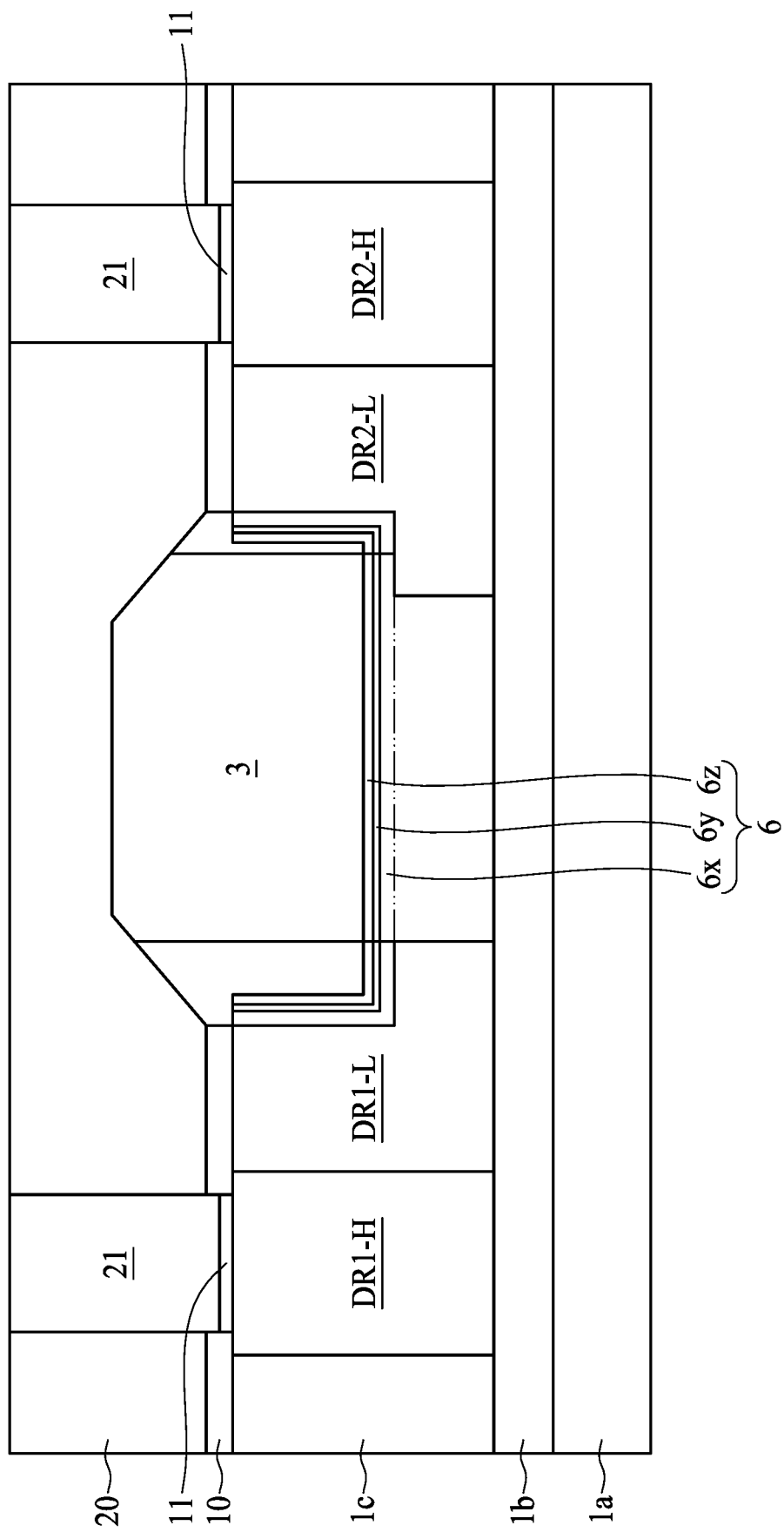

Referring to FIG. 16, FIG. 16 is a cross sectional view of a photo sensing device during intermediate stages of manufacturing operations, according to some embodiments of the present disclosure. A conductive material 21* is formed in the recesses RV and is configured to be in direct contact with the silicide layer 11. The conductive material 21* may be metal. In some embodiments, a position of the conductive material 21* directly above the recesses RV may be recessed at a top surface. Referring to FIG. 17, FIG. 17 is a cross sectional view of a photo sensing device during intermediate stages of manufacturing operations, according to some embodiments of the present disclosure. A CMP operation can be performed on a top surface of the conductive material 21* to remove a portion of the conductive material 21* above the capping layer 20. Thereby, the conductive contacts 21 are formed.

The present disclosure provides a photo sensing device 100 and a method of fabricating the photo sensing device 100. In order to alleviate the issues caused by lattice mismatch between the photosensitive member 3 (which may be intrinsic germanium) and the substrate 1 (which may have a surface layer 1c made by intrinsic silicon), a semiconductor stack 6 can be formed in a recess formed in the substrate 1 prior to forming the photosensitive member 3. The semiconductor stack 6 serves as a buffer between the photosensitive member 3 and the substrate (surface layer 1c) and provides an underlying starting surface that has a lattice constant closer to the photosensitive member 3 for epitaxially growing the photosensitive member 3. Specifically, the semiconductor stack 6 includes a multilayer structure that has one or more layers of a first material (substantially identical with the substrate 1, such as intrinsic silicon) and one or more layers of a second material (substantially identical with the photosensitive member 3, such as intrinsic germanium) alternatively stacked. Each of the semiconductor layers has a thinner thickness (such as less than about 20 nm), thus the effect of lattice conformation is more effective, and a lattice constant each of the semiconductor layers in the semiconductor stack 6 may be relatively closer to the lattice constant of the underlying layer. As a result, the starting surface for growing the photosensitive member 3 has a lattice constant closer to the photosensitive member 3, thus, the issue of dislocation defects may be alleviated.

Furthermore, by designing the thickness of each of the semiconductor layers in the semiconductor stack 6, as discussed in FIG. 1 to FIG. 2B, the effect would further be improved. In addition, by performing cycles of oxidizing an exposed surface of the recess by oxygen thermal annealing and removing the generated oxide layer prior to forming the semiconductor stack 6 may further improve the smoothness of the surface of the recess, thereby alleviating the dislocation defects catalyzed or aggravated by surface roughness.

Furthermore, in order to improve the carrier injection efficiency and reduce the issue of carrier trapping due to band-offset between semiconductor layer 1c and the photosensitive member 3, a portion of the photosensitive member 3 and a portion of the semiconductor stack 6 adjacent/proximal to the first doped region DR1 (having a first conductivity type) can be further doped with the first conductivity type dopant. Similarly, a portion of the photosensitive member 3 and a portion of the semiconductor stack 6 adjacent/proximal to the second doped region DR2 (having a second conductivity type) can be further doped with the second conductivity type dopant.

Some embodiments of the present disclosure provide a photo sensing device, including a substrate, including a silicon layer at a front surface, a photosensitive member extending into and at least partially surrounded by the silicon layer, and a composite layer disposed between the photosensitive member and the silicon layer and surrounding the photosensitive member, wherein the composite layer includes a first material and a second material different from the first material.

Some embodiments of the present disclosure provide a photo sensing device, including a substrate, including a silicon layer at a front surface, wherein the silicon layer includes: a first portion, and a second portion surrounding the first portion, wherein a thickness of the second portion of the silicon layer is greater than a thickness of the first portion of the silicon layer, a photosensitive member over the first portion of the silicon layer, and a semiconductor stack between the photosensitive member and the first portion of the silicon layer, wherein the semiconductor stack includes a first semiconductor layer between the first portion of the silicon layer and the photosensitive member, and a second semiconductor layer between the first semiconductor layer and the photosensitive member.

Some embodiments of the present disclosure provide a method for forming a photo sensing device, including providing a substrate, forming a recess in the substrate, forming a first semiconductor layer conformal to the recess, forming a second semiconductor layer over the first semiconductor layer, and forming a photosensitive member within the recess and surrounded by the first semiconductor layer and the second semiconductor layer.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A photo sensing device, comprising:
    a substrate, comprising a silicon layer at a front surface of the substrate;
    a photosensitive member extending into and at least partially surrounded by the silicon layer, wherein the silicon layer comprises:
        a first doped region adjacent to a first side of the photosensitive member, wherein the first doped region has a first conductivity type; and
        a second doped region adjacent to a second side of the photosensitive member opposite to the first side, wherein the second doped region has a second conductivity type different from the first conductivity type; and
    a composite layer disposed between the photosensitive member and the silicon layer and surrounding the photosensitive member,
    wherein the first doped region comprises a heavily doped region and a lightly doped region adjacent to the heavily doped region, and
    wherein a first portion of the silicon layer directly under the photosensitive member has a first thickness less than a second thickness of a second portion of the silicon layer surrounding the first portion.

2. The photo sensing device of claim 1, further comprising a third doped region disposed in the photosensitive member and adjacent to the lightly doped region, wherein the third doped region has the first conductivity type.

3. The photo sensing device of claim 1, wherein a portion of the composite layer proximal to the first doped region is doped with a dopant having the first conductivity type.

4. The photo sensing device of claim 1, further comprising a conductive contact electrically coupled to the first doped region.

5. The photo sensing device of claim 1, further comprising an insulation layer over the silicon layer, wherein a portion of the photosensitive member protrudes from the insulation layer.

6. The photo sensing device of claim 1, wherein the heavily doped region of the first doped region is apart from the second doped region.

7. The photo sensing device of claim 1, wherein the composite layer comprises a first semiconductor layer contacting the silicon layer, and a second semiconductor layer between the first semiconductor layer and the photosensitive member, wherein the first semiconductor layer includes a first material, and the second semiconductor layer includes a second material different from the first material.

8. A photo sensing device, comprising:
    a substrate, comprising a silicon layer at a front surface of the substrate;
    an insulation layer over the silicon layer;
    a photosensitive member extending into and at least partially surrounded by the silicon layer and the insulation layer; and
    a composite layer disposed between the photosensitive member and the silicon layer and surrounding the photosensitive member,
    wherein the composite layer is configured to be lining along a sidewall of the photosensitive member and a bottom surface of the photosensitive member, and wherein a width of a portion of the photosensitive member surrounded by the insulation layer is greater than a width of a portion of the photosensitive member surrounded by the composite layer.

9. The photo sensing device of claim 8, wherein the silicon layer further comprises:
a first doped region adjacent to a first side of the photosensitive member, wherein the first doped region has a first conductivity type; and
a second doped region adjacent to a second side of the photosensitive member opposite to the first side, wherein the second doped region has a second conductivity type different from the first conductivity type.

10. The photo sensing device of claim 9, wherein a first portion of the composite layer proximal to the first doped region is doped with a dopant having the first conductivity type, and a second portion of the composite layer proximal to the second doped region is doped with a dopant having the second conductivity type.

11. The photo sensing device of claim 8, wherein the composite layer comprises a first semiconductor layer contacting the silicon layer, and a second semiconductor layer between the first semiconductor layer and the photosensitive member, wherein the first semiconductor layer includes a first material, and the second semiconductor layer includes a second material different from the first material.

12. The photo sensing device of claim 11, wherein the composite layer further comprises a third semiconductor layer having the first material and disposed between the second semiconductor layer and the photosensitive member, and a thickness of the first semiconductor layer is greater than a thickness of the third semiconductor layer.

13. The photo sensing device of claim 8, wherein the photosensitive member over the insulation layer comprises a top surface and a facet tapering toward the top surface.

14. A method for forming a photo sensing device, comprising:
providing a substrate;
depositing an insulation layer on the substrate;
forming a recess through the insulation layer and in a first region of the substrate, wherein the recess has a substantially uniform thickness;
forming a composite layer conformal to the recess;
forming a photosensitive member within the recess and surrounded by the composite layer and the insulation layer;

forming a first lightly doped region having a first conductivity type in a second region of the substrate prior to the formation of the recess; and
forming a second lightly doped region having a second conductivity type in a third region of the substrate prior to the formation of the recess,
wherein the second region and the third region are at either side of the first region.

15. The method of claim 14, wherein the first lightly doped region is further formed in the first region at a location proximal to the second region, and the second lightly doped region is further formed in the first region at a location proximal to the third region.

16. The method of claim 14, further comprising, prior to the formation of the composite layer:
forming a first heavily doped region in a portion of the first lightly doped region apart from the second lightly doped region, wherein the first heavily doped region has the first conductivity type; and
forming a second heavily doped region in a portion of the second lightly doped region apart from the first lightly doped region, wherein the second heavily doped region has a second conductivity type.

17. The method of claim 14, further comprising:
doping a dopant having the first conductivity type in a first portion of the composite layer proximal to the second region; and
doping a dopant having the second conductivity type in a second portion of the composite layer proximal to the third region.

18. The method of claim 14, further comprising, prior to the formation of the composite layer:
forming an oxide layer conformal to the recess by oxidizing the substrate; and
removing the oxide layer.

19. The method of claim 18, wherein the first lightly doped region and the second lightly doped region are formed after oxidizing the substrate.

20. The method of claim 14, further comprising:
doping a dopant having the first conductivity type into the photosensitive member proximal to the second region; and
doping a dopant having the second conductivity type into the photosensitive member proximal to the third region.

* * * * *